United States Patent
Lee et al.

(10) Patent No.: US 11,283,011 B2
(45) Date of Patent: Mar. 22, 2022

(54) PHASE CHANGE MEMORY DEVICE HAVING TAPERED PORTION OF THE BOTTOM MEMORY LAYER

(71) Applicant: TAIWAN SEMICONDUCTOR MANUFACTURING CO., LTD., Hsinchu (TW)

(72) Inventors: Tung-Ying Lee, Hsinchu (TW); Shao-Ming Yu, Hsinchu County (TW); Yu-Chao Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/950,753

(22) Filed: Nov. 17, 2020

(65) Prior Publication Data

US 2021/0074913 A1 Mar. 11, 2021

Related U.S. Application Data

(62) Division of application No. 16/414,582, filed on May 16, 2019, now Pat. No. 10,847,716.

(51) Int. Cl.
*H01L 45/00* (2006.01)

(52) U.S. Cl.
CPC .......... *H01L 45/06* (2013.01); *H01L 45/1233* (2013.01); *H01L 45/1253* (2013.01); *H01L 45/144* (2013.01); *H01L 45/16* (2013.01)

(58) Field of Classification Search
CPC . H01L 45/06; H01L 45/1233; H01L 45/1253; H01L 45/141; H01L 45/144
See application file for complete search history.

(56) References Cited

U.S. PATENT DOCUMENTS

2012/0040528 A1  2/2012 Kim
2019/0252607 A1* 8/2019 Pirovano ............. H01L 45/1273

* cited by examiner

*Primary Examiner* — Hoai V Pham
(74) *Attorney, Agent, or Firm* — Maschoff Brennan

(57) ABSTRACT

A phase change memory device includes a bottom electrode, a bottom memory layer, a top memory layer, and a top electrode. The bottom memory layer is over the bottom electrode. The bottom memory layer has a first height and includes a tapered portion and a neck portion. The tapered portion has a second height. A ratio of the second height to the first height is in a range of about 0.2 to about 0.5. The neck portion is between the tapered portion and the bottom electrode. The top memory layer is over the bottom memory layer. The tapered portion of the bottom memory layer tapers in a direction from the top memory layer toward the neck portion. The top electrode is over the top memory layer.

20 Claims, 24 Drawing Sheets

M10'

US 11,283,011 B2

PHASE CHANGE MEMORY DEVICE HAVING TAPERED PORTION OF THE BOTTOM MEMORY LAYER

PRIORITY CLAIM AND CROSS-REFERENCE

The present application is a divisional application of the U.S. patent application Ser. No. 16/414,582, filed May 16, 2019, now U.S. Pat. No. 10,847,716, issued Nov. 24, 2020, which is incorporated herein by reference in its entirety.

BACKGROUND

Phase change memory (PCM) is a type of non-volatile memory in which the state of a function area in the phase change material is switched between crystalline and amorphous, e.g., by a current flow that generates heat. The state of the function area is then used to represent the stored data. For example, after a heat excitation if the function area is in the crystalline state, the stored data is a low logic level (e.g., a Low). But if the function area is in the amorphous state, the stored data is a high logic level (e.g., a High). Phase change memory is also known as phase random access memory (PRAM), phase change random access memory (PCRAM), ovonic unified memory, chalcogenide random access memory (or C-RAM), etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
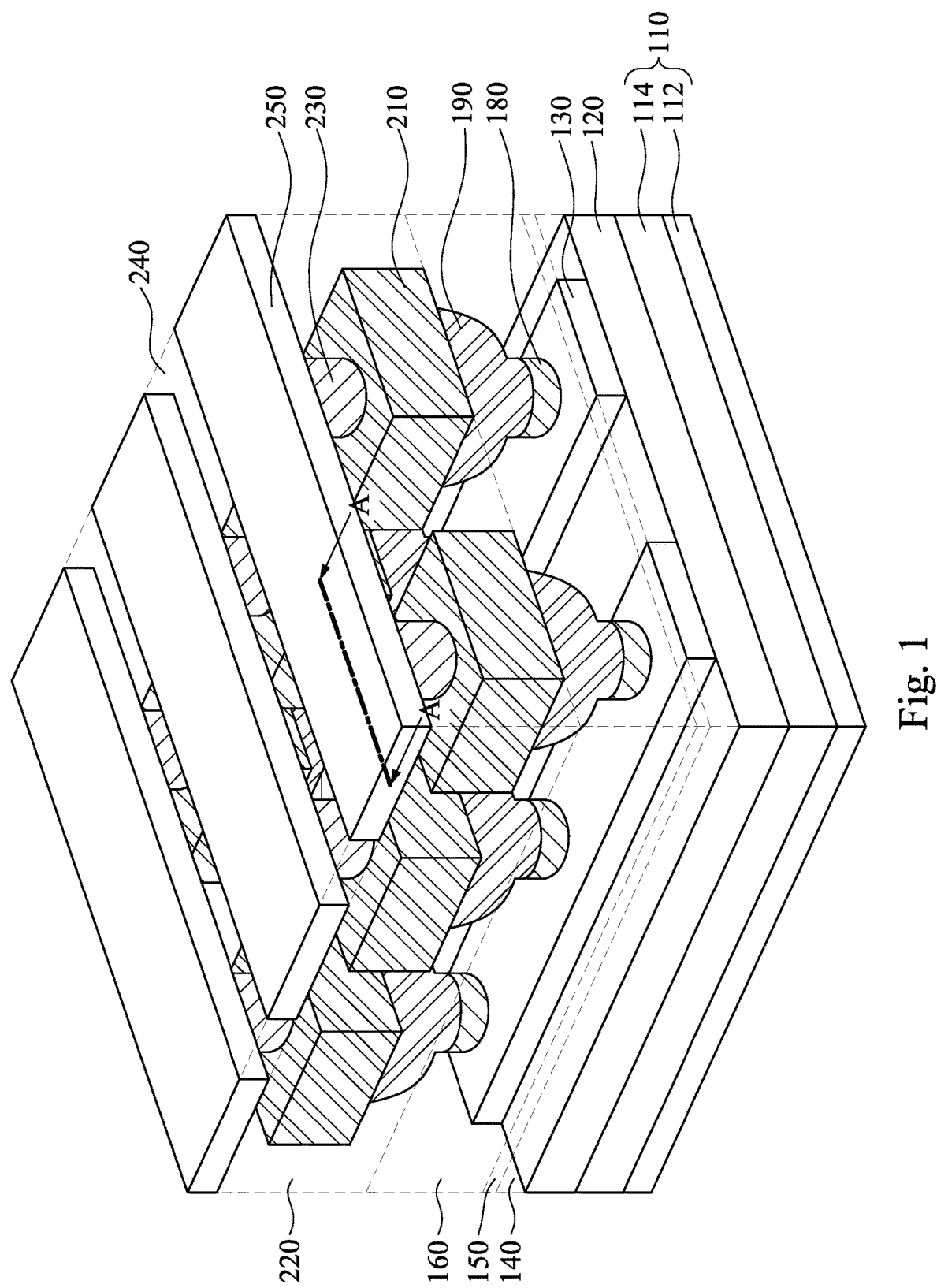
FIG. 1 is a perspective view of a memory device in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximate, meaning that the term "around", "about", "approximately", or "substantially" can be inferred if not expressly stated.

This disclosure relates to memory device fabrications and more specifically to phase change memory (PCRAM) formations by forming a funnel shape phase change layer. Because of the funnel shape phase change layer, a memory device with high phase change efficiency can be formed. Such structure and its method does not add area burden to the device and thus enhances an efficient use of substrate area for higher density devices.

FIG. 1 is a perspective view of a memory device in accordance with various embodiments of the present disclosure. The memory device includes a bottom electrode 180, a bottom memory layer 190, a top memory layer 210, and a top electrode 230. The bottom memory layer 190 is over the bottom electrode 180. The top memory layer 210 is over the bottom memory layer 190. The top electrode 230 is over the top memory layer 210. In some embodiments, the bottom memory layer 190 is directly on (or in contact with) the bottom electrode 180, the top memory layer 210 is directly on (or in contact with) the bottom memory layer 190, and/or the top electrode 230 is directly on (or in contact with) the top memory layer 210. The top memory layer 210 covers the bottom memory layer 190. That is, a bottom surface area of the top memory layer 210 is greater than a top surface area of the bottom memory layer 190. The bottom memory layer 190 has a funnel shape. That is, a top width of the bottom memory layer 190 is greater than a bottom width of the bottom memory layer 190. Or, the bottom memory layer 190 tapers in a direction from the top memory layer 210 toward the bottom electrode 180. During the memory operation, the current flows from the top electrode 230 towards the bottom electrode 180 through the top memory layer 210 and the bottom memory layer 190. Since the bottom memory layer 190 has the funnel shape, the current density is increased in the bottom (neck) portion of the bottom memory layer 190. As such, the heat generated from the current is concentrated in the bottom portion of the bottom memory layer 190. The concentrated heat in the bottom portion of the bottom memory layer 190 lowers the threshold voltage for the memory operation. As such, the size of the memory cell can be reduced.

In FIG. 1, the bottom electrode 180, the bottom memory layer 190, the top memory layer 210, and the top electrode 230 form a memory cell. In FIG. 1, the memory device includes six memory cells arranged as an array. In some embodiments, the memory cell may be a phase change random access memory (PCRAM) or other suitable memory cell.

In FIG. 1, the memory cells are formed over a wafer 110 including a substrate 112 and a circuit 114 formed over the substrate 112. The memory cells may be formed in a logic region or a memory region of the wafer 110. Furthermore, one or more inter-metal dielectric (IMD) layer 120 may be formed between the wafer 110 and the memory cells. The IMD 120 may be an interconnection between the circuit 114 and the memory cells.

Moreover, the memory device further includes bottom conductive lines 130 and top conductive lines 250. The bottom conductive lines 130 are arranged in a first direction and are connected to the bottom electrodes 180. The top conductive lines 250 are arranged in a second direction different from the first direction and are connected to the top electrodes 230. In some embodiments, the first direction is substantially perpendicular to the second direction.

The memory device further includes a first dielectric layer 140, an etch stop layer 150, a second dielectric layer 160, a third dielectric layer 220, and a fourth dielectric layer 240 (all represented by dashed lines for clarity). The first dielectric layer 140 is over the IMD 120 and surrounds the bottom conductive lines 130. The etch stop layer 150 and the second dielectric layer 160 are sequentially over the first dielectric layer 140. The etch stop layer 150 surrounds the bottom electrodes 180, and the second dielectric layer 160 surrounds the bottom electrodes 180 and the bottom memory layer 190. The third dielectric layer 220 is over the second dielectric layer 160 and surrounds the top memory layer 210 and the top electrodes 230. The fourth dielectric layer 240 is over the third dielectric layer 220 and surrounds the top conductive lines 250. In some embodiments, the etch stop layer 150 is directly on (or in contact with) the first dielectric layer 140, the second dielectric layer 160 is directly on (or in contact with) the etch stop layer 150, the third dielectric layer 220 is directly on (or in contact with) the second dielectric layer 160, and/or the fourth dielectric layer 240 is directly on (or in contact with) the third dielectric layer 220.

Figure 2A:
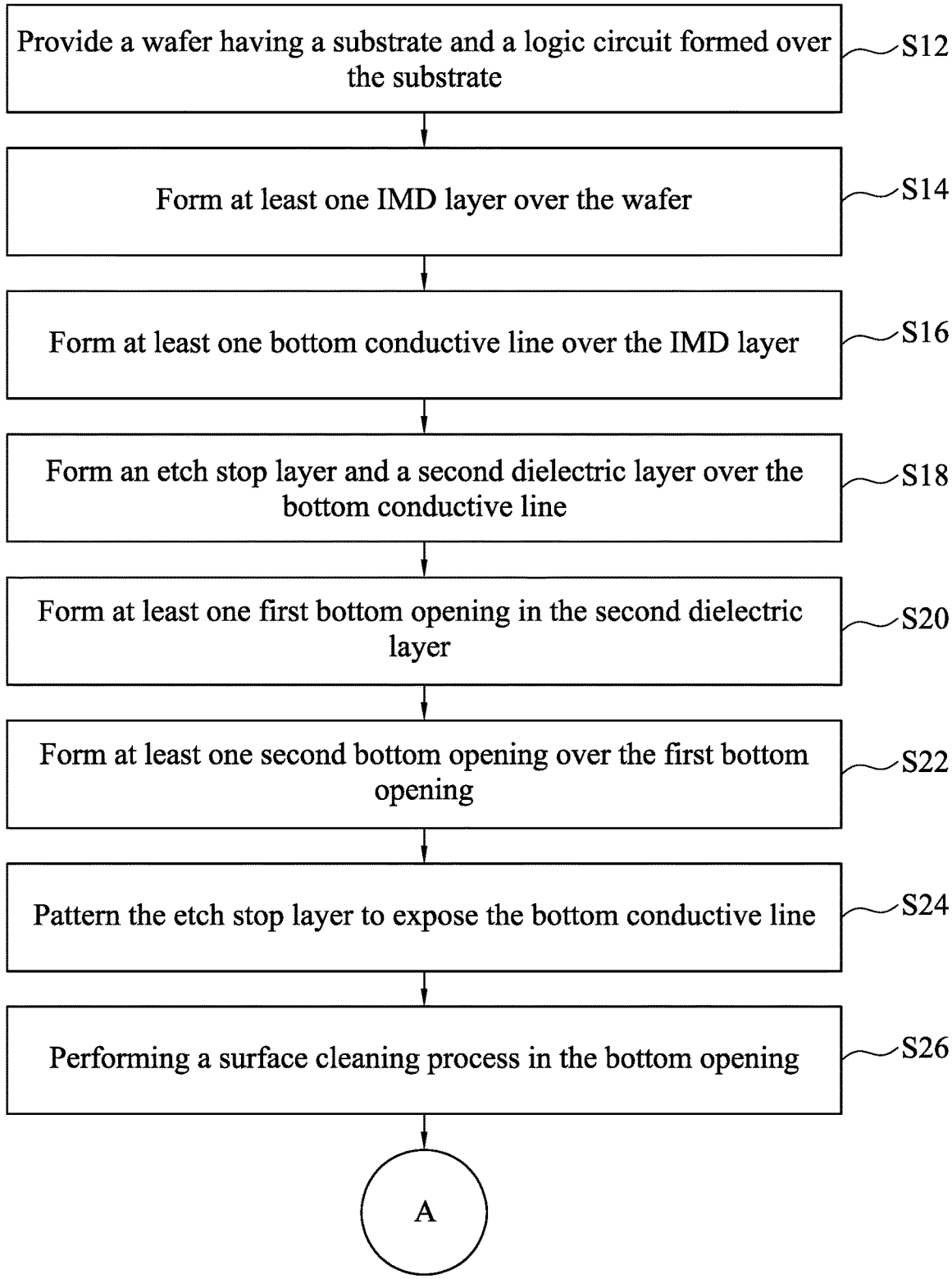
FIGS. 2A and 2B are a flowchart of a method for making a memory device according to aspects of the present disclosure in various embodiments.
Figure 2B:
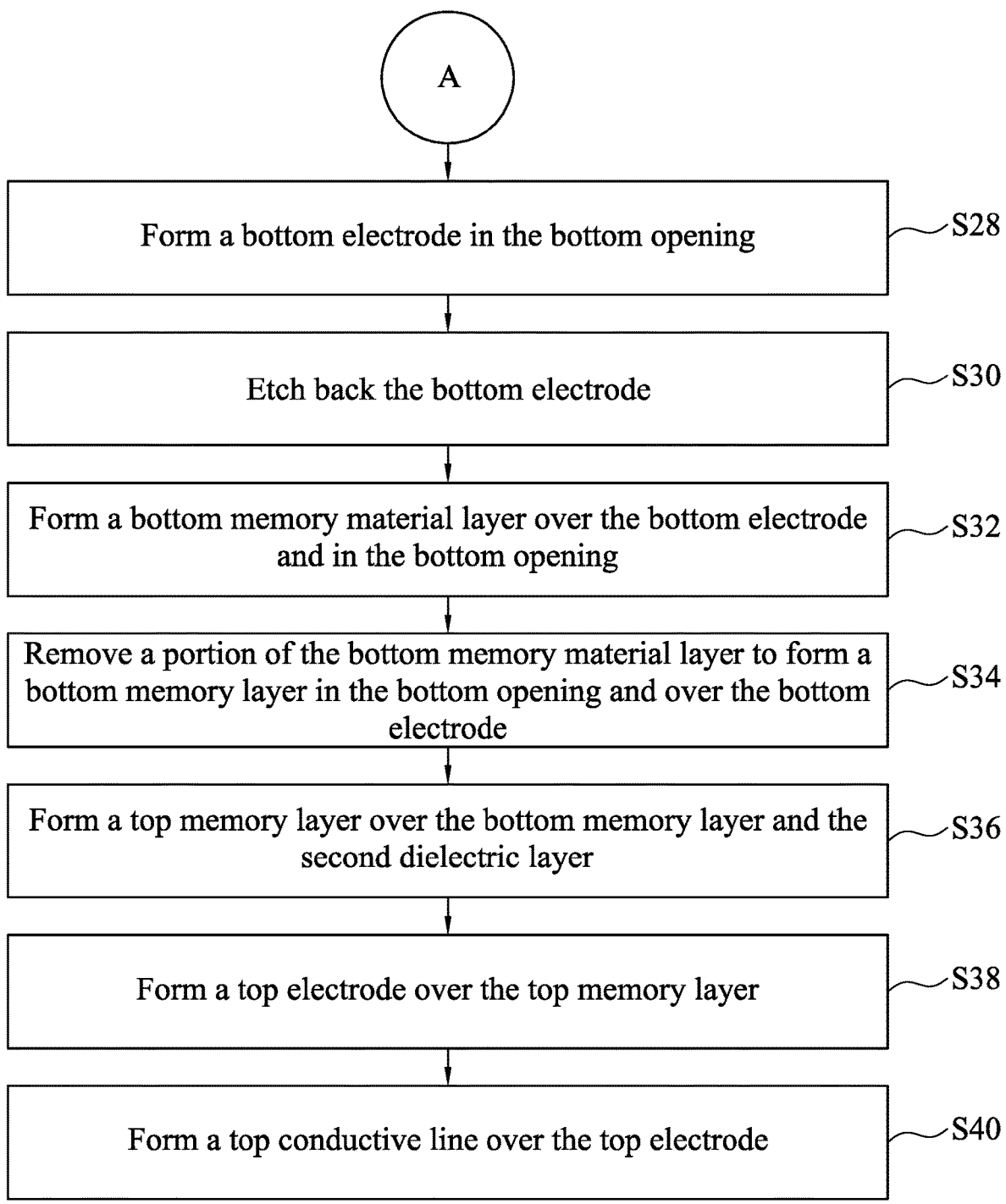
Figure 3A:
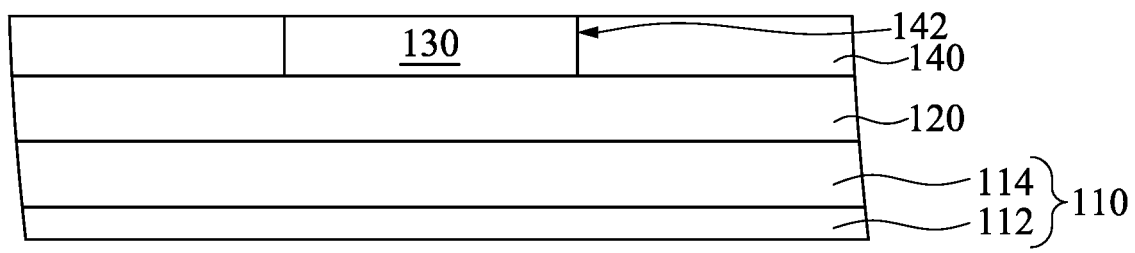
FIGS. 3A-3N illustrate cross-sectional views for making the memory device at different stages according to aspects of the present disclosure in various embodiments.

FIGS. 2A and 2B are a flowchart of a method M10 for making a memory device according to aspects of the present disclosure in various embodiments. Various operations of the method M10 are discussed in association with cross-section diagrams FIGS. 3A-3N, where illustrate cross-sectional views along the line A-A illustrated in FIG. 1. Throughout the various views and illustrative embodiments, like reference numbers are used to designate like elements. In operation S12 of method M10, a wafer 110 having a substrate 112 and a circuit 114 formed over the substrate 112 is provided, as shown in FIG. 3A. The substrate 112 may be a silicon substrate. Alternatively, the substrate 112 may include another elementary semiconductor, such as germanium; a compound semiconductor including silicon carbide; an alloy semiconductor including silicon germanium; or combinations thereof. In some embodiments, the substrate 112 is a semiconductor on insulator (SOI) substrate. The substrate 112 may include doped regions, such as p-wells and n-wells. In some embodiments, the wafer 110 is a workpiece that includes the substrate 112 and various features formed in and over and attached to the substrate 112. In some embodiments, the circuit 114 includes transistors formed by transistor fabrication processes and may be a planar transistor, such as polysilicon gate transistors or high-k metal gate transistors, or a multi-gate transistor, such as fin field effect transistors. After the transistors are formed, one or more metal/dielectric layers of a multi-level interconnect (MLI) is formed over the transistors. According to some embodiments, plural metal/dielectric layers are formed over the transistors. In some embodiments, the circuit 114 may be a logic circuit or a memory circuit.

In operation S14 of method M10 in FIG. 2A, at least one IMD layer 120 is formed over the wafer 110, as shown in FIG. 3A. The IMD layer 120 may provide electrical interconnection between the memory cells and the circuit 114 as well as structural support for the various features of the memory device during many fabrication process operations, some of which will be discussed herein. For example, the IMD layer can act as structural support for memory cells formed thereon. Specifically, the memory cells are formed over the IMD layer 120 as shown in FIG. 1. In some embodiments, the IMD layer 120 may be silicon oxide, low-k silicon oxide such as a porous silicon oxide layer, other suitable interlayer dielectric (ILD) material, other suitable inter-metal dielectric material, combinations thereof, or the like. In some embodiments, the IMD layer 120 is a low-k dielectric layer made from extra low-k materials, extreme low-k materials, combinations thereof, or the like. In some embodiments, the IMD layer 120 may have a dielectric constant lower than 2.4. In some embodiments, the IMD layer 120 is made using diethoxymethylsilane (mDEOS) or the like as a precursor gas in a chemical vapor deposition (CVD) process. However, other low-k dielectric materials may be used as well. The IMD layer 120 also includes conductive elements for interconnecting the memory cells and the circuit 114.

In operation S16 of method M10 in FIG. 2A, at least one bottom conductive line 130 is formed over the IMD layer 120, as shown in FIG. 3A. In some embodiments, the bottom conductive line 130 is formed of copper or copper alloys. In some other embodiments, the bottom conductive line 130 may be formed of conductive materials such as aluminum, tungsten, carbon, TaN, or other suitable materials. In still some other embodiments, the bottom conductive line 130 may be a bilayer structure (e.g., a TaN layer and a TiN layer formed on the TaN layer). In some embodiments, a first dielectric layer 140 is formed over the IMD layer 120, and at least one trench 142 is formed in the first dielectric layer 140 to expose the IMD layer 120. The bottom conductive line 130 is then formed in the trench 142. In some embodiments, the first dielectric layer 140 may include, for example, silicon oxide, low-k silicon oxide such as a porous silicon oxide layer, other suitable dielectric material, combinations thereof, or the like. In FIGS. 1 and 3A, the bottom conductive line 130 extends in a first direction.

Figure 3B:
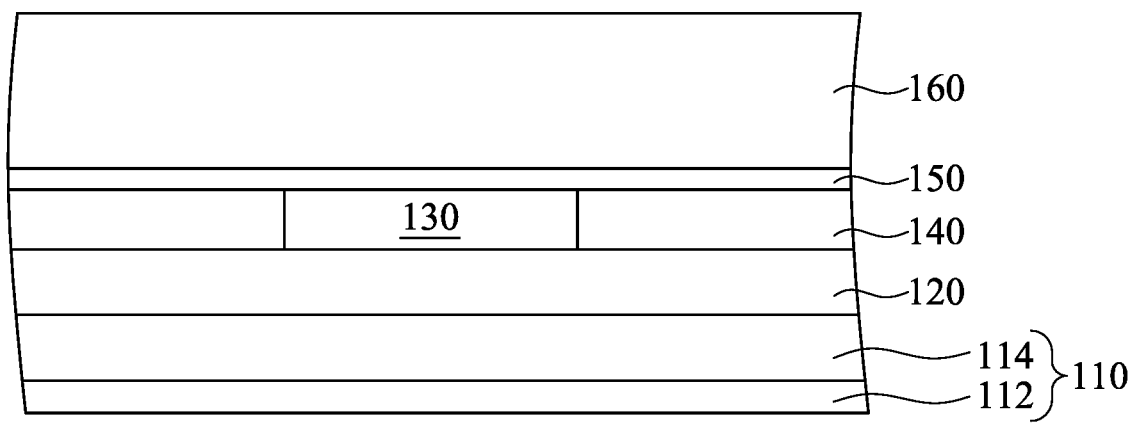

In operation S18 of method M10 in FIG. 2A, an etch stop layer 150 and a second dielectric layer 160 are sequentially formed over the bottom conductive line 130 and the first dielectric layer 140, as shown in FIG. 3B. The etch stop layer 150 is deposited over the bottom conductive line 130 and the first dielectric layer 140. The etch stop layer 150 may include a metal nitride, a metal carbide, a metal oxide, combinations thereof, and/or the like, wherein the metal may include tungsten (W), aluminum (Al), manganese (Mn), Copper (Cu), or multi-layers thereof. The etch stop layer 150 is formed of a material that has a high etching selectivity with the second dielectric layer 160, and hence the etch stop layer 150 may be used to stop the etching of second dielectric layer 160. The second dielectric layer 160 may include, for example, silicon oxide, low-k silicon oxide such as a porous silicon oxide layer, other suitable dielectric material, combinations thereof, or the like. The second dielectric layer 160 is deposited over the etch stop layer 150.

Figure 3C:
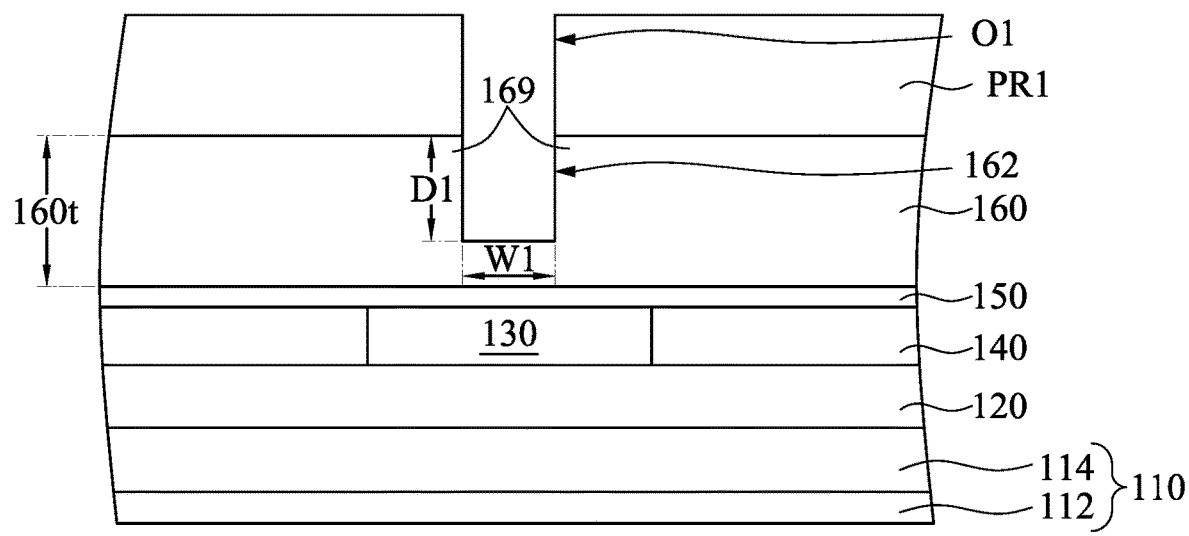

In operation S20 of method M10 in FIG. 2A, at least one first bottom opening 162 is formed in the second dielectric layer 160, as shown in FIG. 3C. For example, a patterned photoresist PR1 is formed over the structure of FIG. 3B, i.e., over the second dielectric layer 160, such that the photoresist PR1 exposes a portion of the second dielectric layer 160. In some embodiments, a photoresist material may be formed over the second dielectric layer 160 by using spin-coating or other suitable techniques, and the photoresist material is patterned to form the photoresist PR1. The photoresist PR1 has at least one opening O1 which exposes the second dielectric layer 160. Then, the second dielectric layer 160 is patterned (etched) using the photoresist PR1 as a mask to form the first bottom opening 162 in the second dielectric layer 160. The first bottom opening 162 is a blind hole, which means that the first bottom opening 162 does not extend to the etch stop layer 150. The first bottom opening 162 has a depth D1 smaller than a thickness 160t of the second dielectric layer 160. In some embodiments, the depth D1 of the first bottom openings 162 is greater than half of the thickness 160t of the second dielectric layer 160. In some embodiments, the first bottom opening 162 has a width W1. Sharp corners 169 are formed at the interconnection between the top surface of the second dielectric layer 160 and a sidewall of the first bottom opening 162.

Figure 3D:
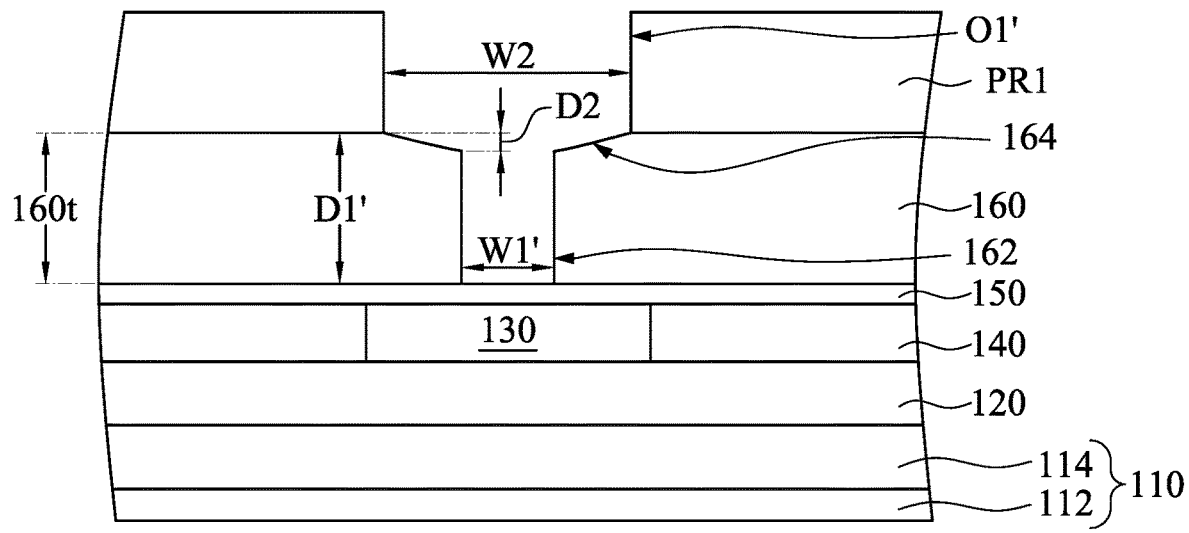

In operation S22 of method M10 in FIG. 2A, at least one second bottom opening 164 is formed over the first bottom opening 162, as shown in FIG. 3D. In other words, top portions of the first bottom openings 162 are widened, and/or the sharp corner 169 (see FIG. 3C) is removed or rounded. Specifically, a photoresist trimming process is performed on the photoresist PR1 to widen the opening O1'. In some embodiments, the photoresist trimming process may be an etching process. As such, the opening O1' further exposes another portion of the top surface of the second dielectric layer 160. Then, the exposed portions of the second dielectric layer 160 are then patterned (etched) to form second bottom openings 164 over the first bottom openings 162. During this operation, the first bottom openings 162 are deepened to expose the etch stop layer 150. The second bottom openings 164 may be formed by performing an etching process, such as dry etching, wet etching, or combinations thereof. In some embodiments, the etching process is a dry etching process using etching gases as $CH_2F_2$ and/or HBr. Further, He may be added in the etching gases in some embodiments.

In greater detail, the second bottom opening 164 overlaps the first bottom opening 162. The first bottom opening 162 has a width W1' and a depth D V. The width W1' is substantially the same as the width W1 in FIG. 3C, and the depth D1' is greater than the depth D1 in FIG. 3C and is substantially the same as the thickness 160t of the second dielectric layer 160. The second bottom opening 164 has a width W2 and a depth D2. The width W2 of the second bottom opening 164 is greater than the width W1' of the first bottom opening 162, and the depth D2 of the second bottom opening 164 is less than the depth Dr of the first bottom opening 162.

In some embodiments, the depth D2 may be in a range of about 2 nm to about 20 nm. If the depth D2 is less than 2 nm, the second bottom opening 164 is not easy to be formed, and the sharp corner 169 (see FIG. 3C) may not be removed or rounded. If the depth D2 is greater than about 20 nm, the whole first bottom opening 162 may be replaced with the second bottom opening 164, and the whole bottom opening may have a bigger critical dimension (CD). Further, the sharp corner may be formed around the second bottom opening 164. In some embodiments, the width W2 may be in a range of about 50 nm to about 300 nm. If the width W2 is less than about 50 nm, the first bottom opening 162 may not be widened. If the width W2 is greater than about 300 nm, the layout area of each memory cell may be increased.

Figure 3E:
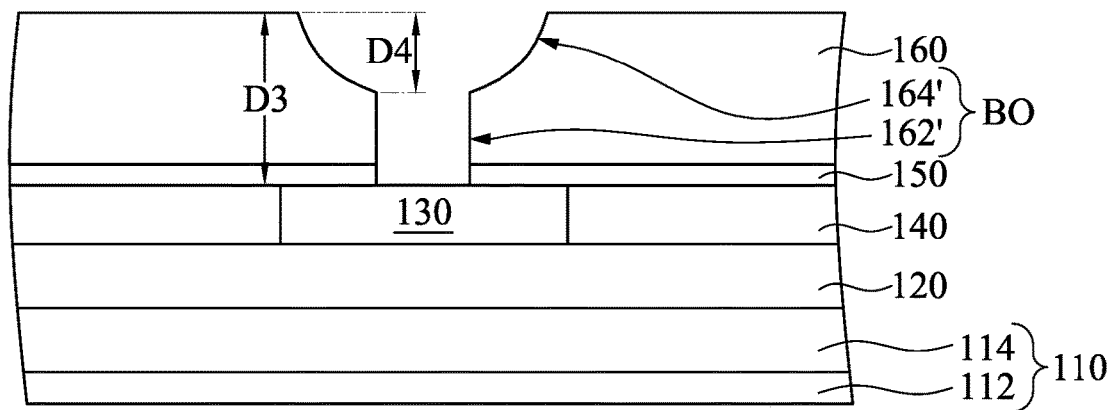

In operation S24 of method M10 in FIG. 2A, the etch stop layer 150 is patterned to expose the bottom conductive line 130, as shown in FIG. 3E. During this process, the second bottom openings 164 are deepened. Specifically, the photoresist PR1 in FIG. 3D is removed by using stripping or ashing process, and then a selectively etching process is performed. The etch stop layer 150 is selectively etched while the second dielectric layer 160 and the bottom conductive line 130 are barely etched or etched relatively slow. The patterning of the etch stop layer 150 is performed with a first selectivity between the removal rate of the etch stop layer 150 and the removal rate of the second dielectric layer 160, with the removal rate of the etch stop layer 150 is greater than the removal rate of the second dielectric layer 160. Assuming the removal rate of the etch stop layer 150 is RR1, and the removal rate of the second dielectric layer 160 is RR2, the first selectivity, which is RR1/RR2, may be greater than about 10, and may also be between about 10 and about 100 in some exemplary embodiments. Also, the patterning of the etch stop layer 150 is performed with a second selectivity between the removal rate of the etch stop layer 150 and the removal rate of the bottom conductive lines 130, with the removal rate of the etch stop layer 150 is greater than the removal rate of the bottom conductive lines 130. Assuming the removal rate of the etch stop layer 150 is RR1, and the removal rate of the bottom conductive lines 130 is RR3, the second selectivity, which is RR1/RR3, may be greater than about 100, and may also be between about 100 and about 1000 in some exemplary embodiments. It is appreciated, however, that the values recited throughout the description are merely examples, and may be changed to different values.

In some embodiments, the selectively etching process may be a dry etching process using etching gases such as $C_4F_8$, $C_4F_6$, combinations thereof, or the like. In some other embodiments, Ar, He, or other suitable gases may be added into the etching process. The etching period may be in a range of about 20 seconds to about 100 seconds. If the etching period is lower than about 20 seconds, the etch stop layer 150 may not be etched to the bottom. If the etching period is greater than about 100 seconds, the etch stop layer 150 may be over etched. In some embodiments, the amount of $C_4F_8$ gas is greater than the amount of $C_4F_6$ gas to obtain the second bottom opening 164 having a concave upward sidewall. In other words, the gas ratio of $C_4F_8/C_4F_6$ is greater than about 1 in this case.

Moreover, during this process, since the etching gases have high etching selectivity between the etch stop layer 150 and the bottom conductive line 130, the etching gases is not easy to etch the bottom conductive line 130 when the etch stop layer 150 is patterned to expose the bottom conductive line 130. Instead, the etching gases remain in the first bottom opening 162' and the second bottom opening 164' and start to etch the second dielectric layer 160 since the first selectivity (between the etch stop layer 150 and the second dielectric layer 160) is lower than the second selectivity (between the etch stop layer 150 and the bottom conductive line 130). Since the second bottom opening 164' has larger surface area than the first bottom opening 162', the second bottom opening 164' is etched (widened and/or deepened) faster than the first bottom opening 162'. Furthermore, since the etch stop layer 150 is thin enough, the etching gases are not easy to over etch the etch stop layer 150 while the etching gases etch the second dielectric layer 160.

In FIG. 3E, the selectively etching process is performed to form the first bottom opening 162' and the second bottom opening 164'. The first bottom opening 162' extends to the top surface of the bottom conductive line 130, and has a depth D3 substantially the same as the depth D1' (see FIG. 3D) (since the etch stop layer 150 is thin). The second bottom opening 164' has a depth D4 deeper than the depth D2 (see FIG. 3D) and a ratio of depths D4/D3 is in a range of about 0.2 to about 0.5. In FIG. 3E, the first bottom opening 162' and the second bottom opening 164' are together referred to as a bottom opening BO, which is funnel shaped.

Figure 3F:
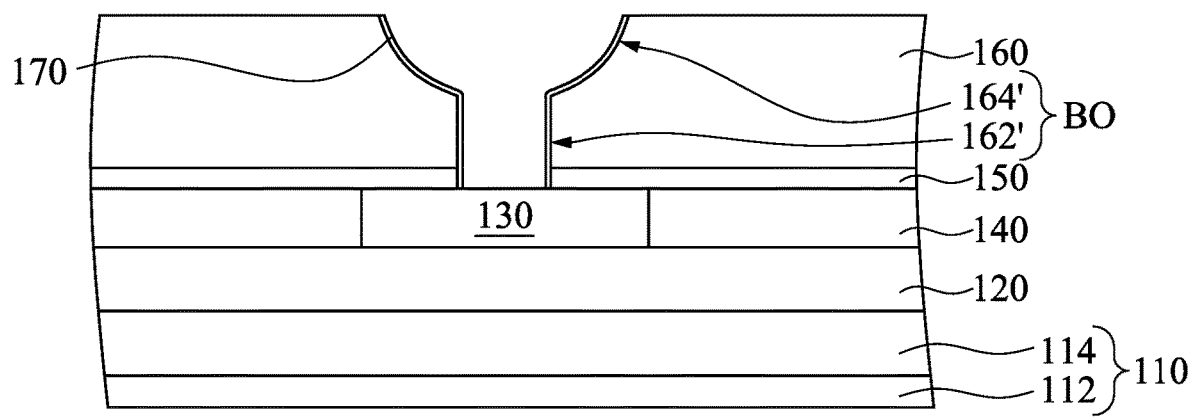

In operation S26 of method M10 in FIG. 2A, a surface cleaning process is performed in the bottom opening BO, as shown in FIG. 3F. Specifically, during the selectively etching process, when the bottom conductive line 130 is exposed, a metal oxide layer may be formed on the exposed top surface thereof. As such, the surface cleaning process may be performed on the bottom conductive line 130 exposed by the bottom opening BO to remove the metal oxide layer. In some embodiments, the surface cleaning process may be performed by providing $H_2$ gases to the bottom opening BO. The $H_2$ gases will react with the metal oxide layer, such that the metal oxide layer is removed to expose the conductive material of the bottom conductive line 130. For example, the bottom conductive line 130 may be made of copper, and the metal oxide layer is copper oxide. The $H_2$ gases react with the copper oxide to remove the oxide from copper, such that the (pure) copper is exposed by the bottom opening BO. In some embodiments, the surface cleaning process may be performed for about 20 seconds or longer. Moreover, the selectively etching process in operation S24 may form rough sidewalls on the bottom opening BO, the $H_2$ gases also help forming a polymer layer 170 (not shown in FIG. 1 for clarity) on the sidewalls of the bottom opening BO, such that the sidewalls of the bottom opening BO become smooth. The smooth sidewall is good for the electron migration sustain in the following formed bottom electrode 180 and the bottom memory layer. In some embodiments, the polymer layer 170 may include $SiClO_x$, $SiBrO_x$, $CH_x$, or combinations thereof. Further, the polymer layer 170 may have a thickness in a range of about 1 nm to about 2 nm.

Figure 3G:
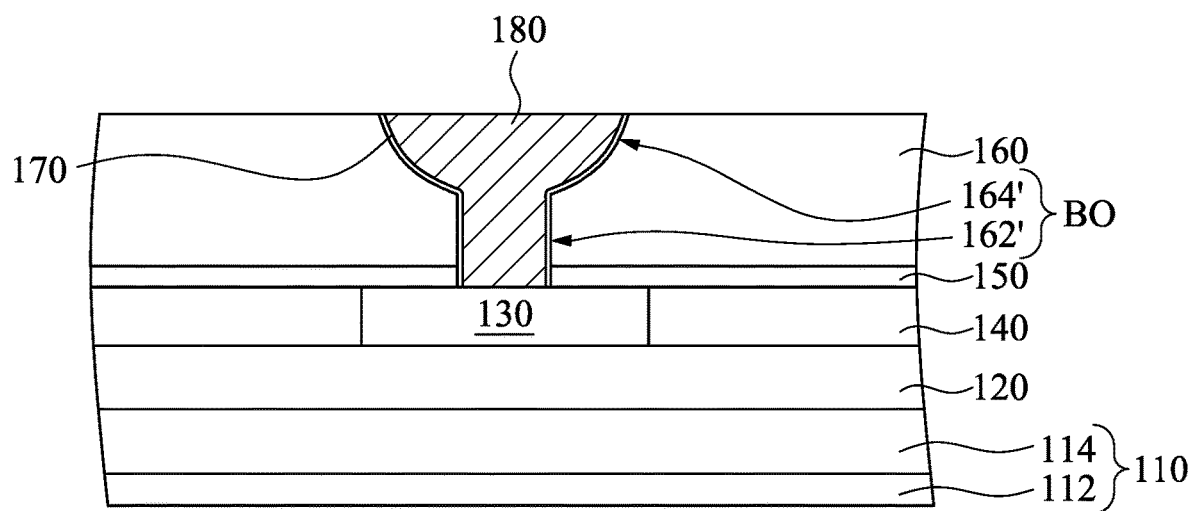

In operation S28 of method M10 in FIG. 2B, a bottom electrode 180 is formed in the bottom opening BO, as shown in FIG. 3G. The bottom electrode 180 is formed in the bottom opening BO and over the polymer layer 170. The bottom electrode 180 is electrically connected to the bottom conductive line 130. Since the native oxide layer over the bottom conductive line 130 has been removed, the bottom electrode 180 and the bottom conductive line 130 have well electrically connection, good for RC-delay of the formed memory device. In some embodiments, a filling layer is formed on the second dielectric layer 160 and in the bottom opening BO, and excessive portions of the filling layer is removed by performing a CMP process to form the bottom electrode 180. The bottom electrode 180 can be made of Ti, TiN, or other suitable materials. In some embodiments, a barrier layer may be formed between the bottom electrode 180 and the second dielectric layer 160. The barrier layer can improve the adhesion between the bottom conductive line 130 and a material formed thereon (such as the bottom electrode 180), or prevent a diffusion of a metal from diffusing from the bottom electrode 180 into the second dielectric layer 160. The barrier layer may include metal nitride materials. For example, the barrier layer includes Ta, TaN, or other suitable materials. In some embodiments, the barrier layer includes a single layer or multiple layers. For a multiple-layer configuration, the layers include different compositions of metal nitride from each other.

Figure 3H:
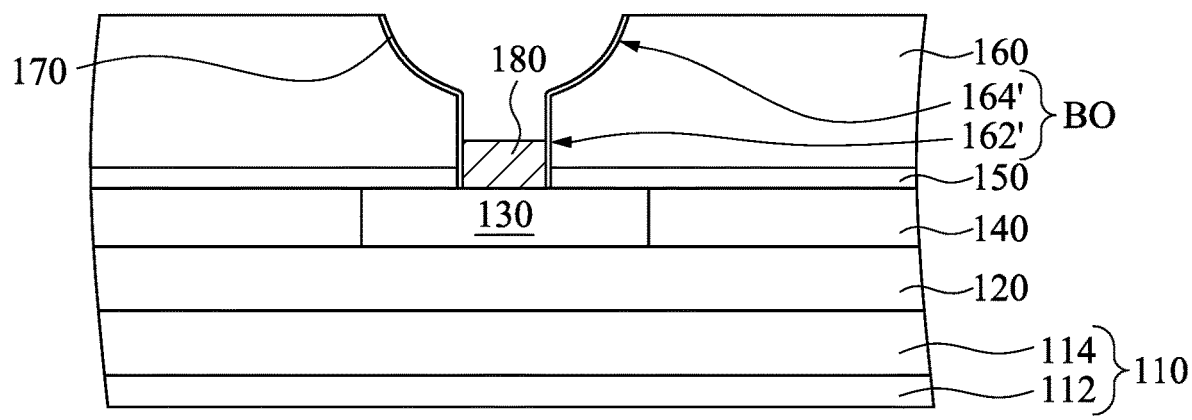

In operation S30 of method M10 in FIG. 2B, the bottom electrode 180 is etched back, as shown in FIG. 3H. Specifically, the bottom electrode 180 may, in some embodiments, be etched to a predetermined depth by, for example, a selective dry etch. In some embodiments, the bottom electrode 180 may be etched back such that the bottom electrode 180 is disposed in the first bottom opening 162' but separated from the second bottom opening 164'. That is, the bottom electrode 180 has a thickness 180t lower than a difference of depths D3-D4 (see FIG. 3E). With such configuration, the following formed bottom memory layer 190 has funnel shape that provide a good heating concentrating performance. Further, since the bottom electrode 180 is selectively etched back, the profile of the bottom opening BO substantially remains in this process.

Figure 3I:
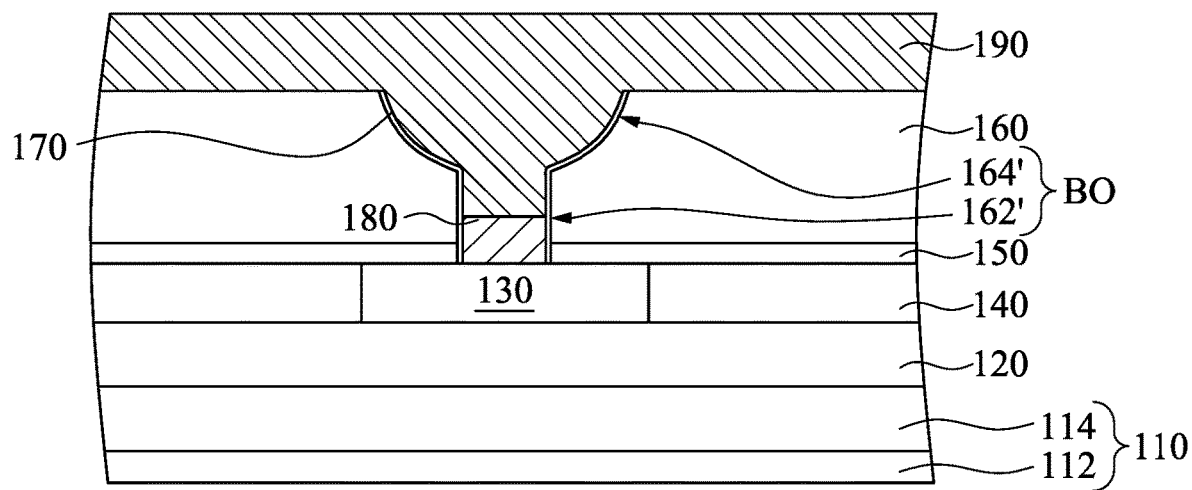

In operation S32 of method M10 in FIG. 2B, a bottom memory material layer 190' is formed over the bottom electrode 180 and in the bottom opening BO, as shown in FIG. 3I. Specifically, the bottom memory material layer 190' may be deposited over the structure of FIG. 3H (i.e., over the second dielectric layer 160 and the bottom electrode 180 and filling the remaining bottom opening BO). In some embodiments, the bottom memory material layer 190' may be deposited by physical vapor deposition (PVD), chemical vapor deposition (CVD), atomic layer deposition (ALD) process, or other suitable process(es). When the bottom memory material layer 190' is formed by performing the physical vapor deposition (PVD), the formed bottom memory material layer 190' is dense. As such, the formed bottom memory layers 190 (see FIGS. 1 and 3J) in different memory cells have similar or the same density. This configuration improves the performance uniformity of the memory cells. Furthermore, the PVD provides a purified deposited layer (well composition control), which improves the quality of the memory layer. Moreover, since the second bottom opening 164' is wide, the profile of the bottom opening BO prevents the formation of seams or voids in the bottom memory material layer 190'.

In some embodiments, the memory device (see FIG. 1) includes PCRAMs, and the bottom memory material layer 190' of PCRAM may be a phase changing material including chalcogenide alloy such as GeSbTe (GST). Alternatively, the bottom memory material layer 190' may include Si—Sb—Te alloys, Ga—Sb—Te alloys, As—Sb—Te alloys, Ag—In—Sb—Te alloys, Ge—In—Sb—Te alloys, Ge—Sb alloys, Sb—Te alloys, Si—Sb alloys, or combinations thereof. The phase change materials have a crystalline state with a low resistivity, and an amorphous state with a high resistivity.

Figure 3J:
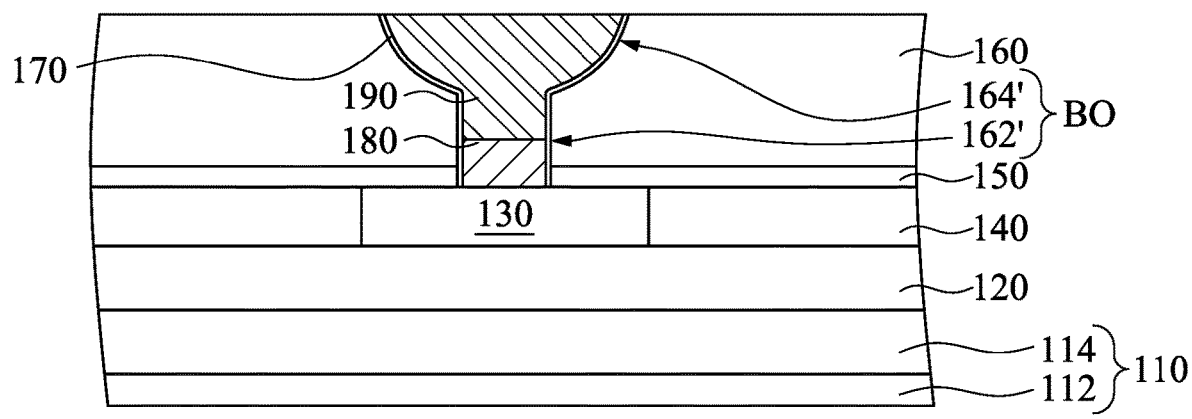

In operation S34 of method M10 in FIG. 2B, a portion of the bottom memory material layer 190' (see FIG. 3I) outside the bottom opening BO is removed to form bottom memory layer 190 in the bottom openings BO and over the bottom electrode 180, as shown in FIG. 3J. In some embodiments, the portion of the bottom memory material layer 190' disposed over the second dielectric layer 160 is polished away in a planarization process. The planarization process may include a chemical-mechanical-polishing (CMP) process, for example. In this case, the second dielectric layer 160 may serve as a polishing-stop layer for the planarization process.

Figure 3K:
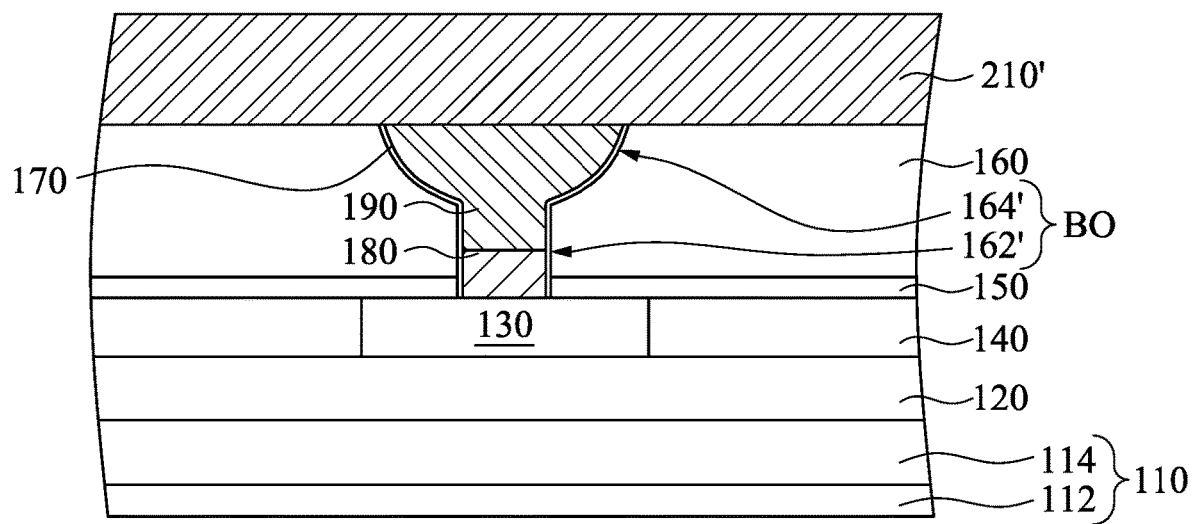
Figure 3L:
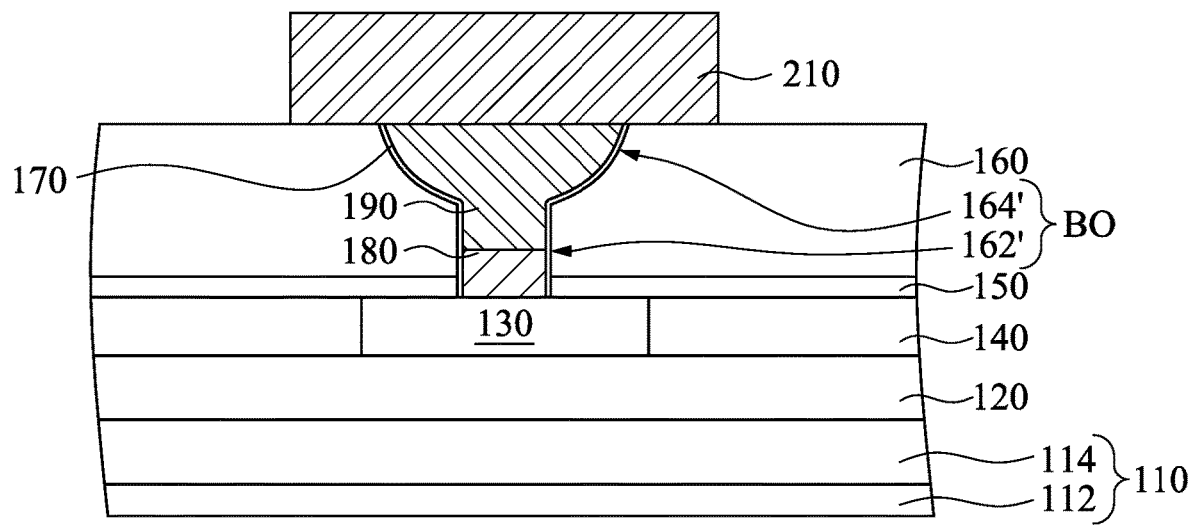

In operation S36 of method M10 in FIG. 2B, a top memory layer 210 is formed over the bottom memory layer 190 and the second dielectric layer 160, as shown in FIGS. 3K and 3L. Specifically, in FIG. 3K, a top memory material layer 210' is deposited over the structure of FIG. 3J (i.e., over the second dielectric layer 160 and the bottom memory layer 190). In some embodiments, the memory device (see FIG. 1) includes PCRAMs, and the top memory material layer 210' of PCRAM may be a phase changing material including chalcogenide alloy such as GeSbTe (GST). Alternatively, the top memory material layer 210' may include Si—Sb—Te alloys, Ga—Sb—Te alloys, As—Sb—Te alloys, Ag—In—Sb—Te alloys, Ge—In—Sb—Te alloys, Ge—Sb alloys, Sb—Te alloys, Si—Sb alloys, or combinations thereof. The phase change materials have a crystalline state with a low resistivity, and an amorphous state with a high resistivity. In some embodiments, the top memory material layer 210' and the bottom memory material layer 190' may have different or the same material(s).

The top memory material layer 210' may be formed by a suitable technique, such as physical vapor deposition (PVD), such as a sputtering process with a metallic target and with a gas supply to the PVD chamber. Other chemical vapor deposition (CVD) techniques may be used. In another example, the top memory material layer 210' may be formed by atomic layer deposition (ALD). In yet another example, the top memory material layer 210' may be formed an electron-beam deposition process.

Reference is made to FIG. 3L. Next, the top memory material layer 210' is patterned to form a top memory layer 210. The patterning includes a photolithography operation where a photoresist is deposited, a pattern is defined by exposing photoresist to a radiation, and developing the photoresist to create a photoresist pattern. The photoresist pattern is then used as an etch mask to protect desired portions of the top memory material layer 210'. The etch process stops when the second dielectric layer 160 is reached. The top memory layer 210 is connected to the bottom memory layer 190.

Figure 3M:
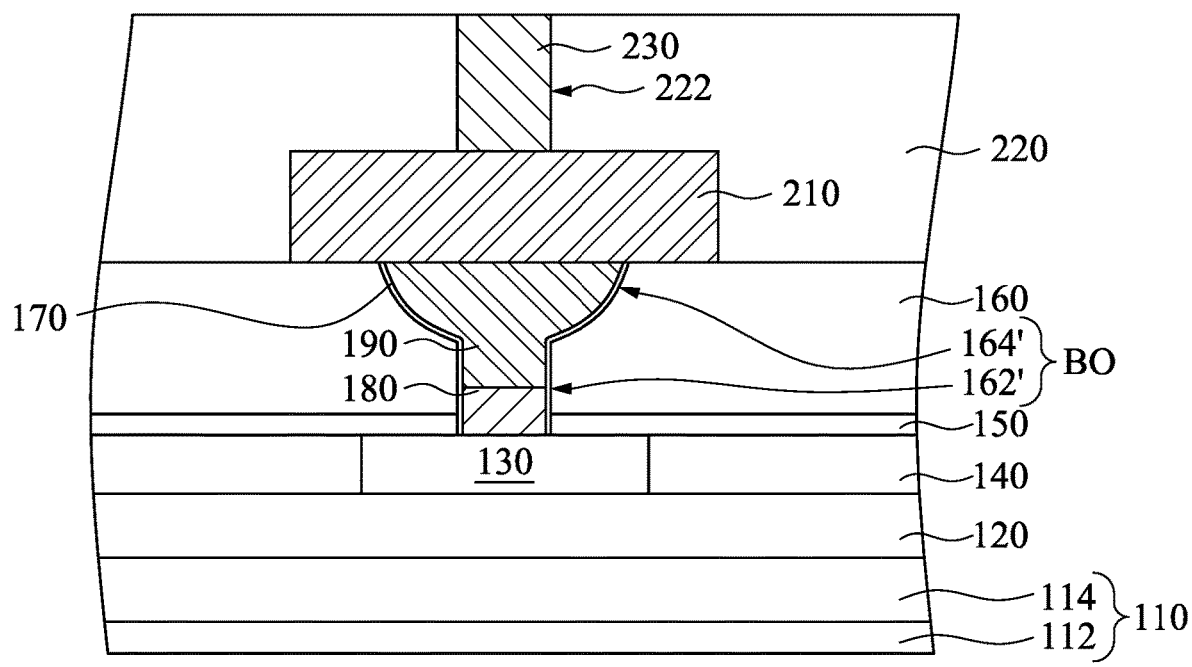

In operation S38 of method M10 in FIG. 2B, a top electrode 230 is formed over the top memory layer 210, as shown in FIG. 3M. For example, a third dielectric layer 220 is deposited over the structure of FIG. 3L (i.e., over the top memory layer 210 and the second dielectric layer 160). The third dielectric layer 220 may include the same material as the second dielectric layer 160 in some embodiments. The third dielectric layer 220 may include, for example, silicon oxide, low-k silicon oxide such as a porous silicon oxide layer, other suitable dielectric material, combinations thereof, or the like.

In some embodiments, a damascene process is performed on the third dielectric layer 220. Specifically, at least one top opening 222 formed in the third dielectric layer 220, then a top electrode 230 is formed in the third dielectric layer 220. The top electrode 230 may be metal, metal-nitride (e.g., TiN), doped polysilicon, other suitable conductive material, combinations thereof, or the like. For example, the top electrode 230 may be tantalum nitride, titanium nitride, platinum, other suitable metal, combinations thereof, or the like.

Figure 3N:
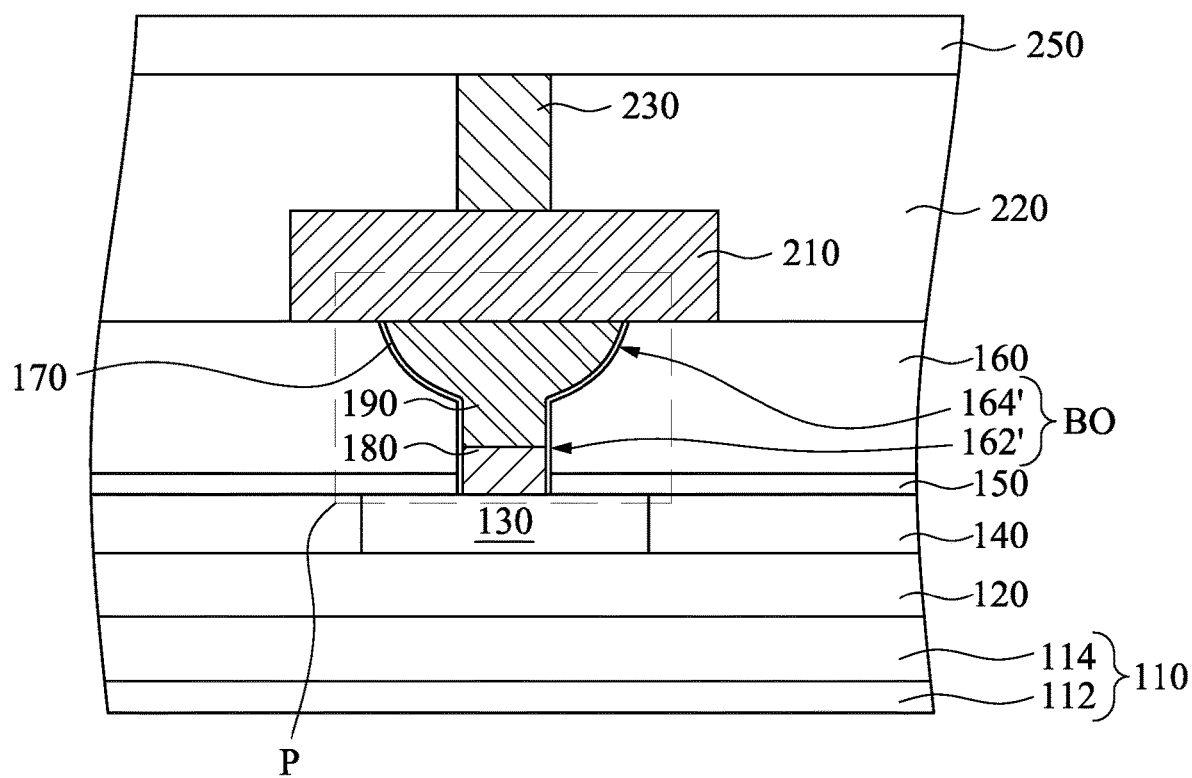

In operation S40 of method M10 in FIG. 2B, a top conductive line 250 is formed over the top electrode 230, as shown in FIG. 3N. Specifically, a fourth dielectric layer 240 (shown in FIG. 1) is deposited over the structure of FIG. 3M (i.e., over the top electrode 230 and the third dielectric layer 220). The fourth dielectric layer 240 may include the same material as the second dielectric layer 160 in some embodiments. The fourth dielectric layer 240 may include, for example, silicon oxide, low-k silicon oxide such as a porous silicon oxide layer, other suitable dielectric material, combinations thereof, or the like.

In some embodiments, a damascene process is performed on the fourth dielectric layer 240. Specifically, a plurality of top line openings are formed in the fourth dielectric layer 240. After the formation, the top line openings respectively expose the top electrodes 230. The, filling material is formed in the top line openings. The filling material is electrically connected to the top electrodes 230. Then, excessive portion of the filling material is removed by performing a CMP process to form top conductive lines 250 respectively in the top line openings. The filling material may have similar or the same material as the bottom conductive lines 130.

Figure 4:
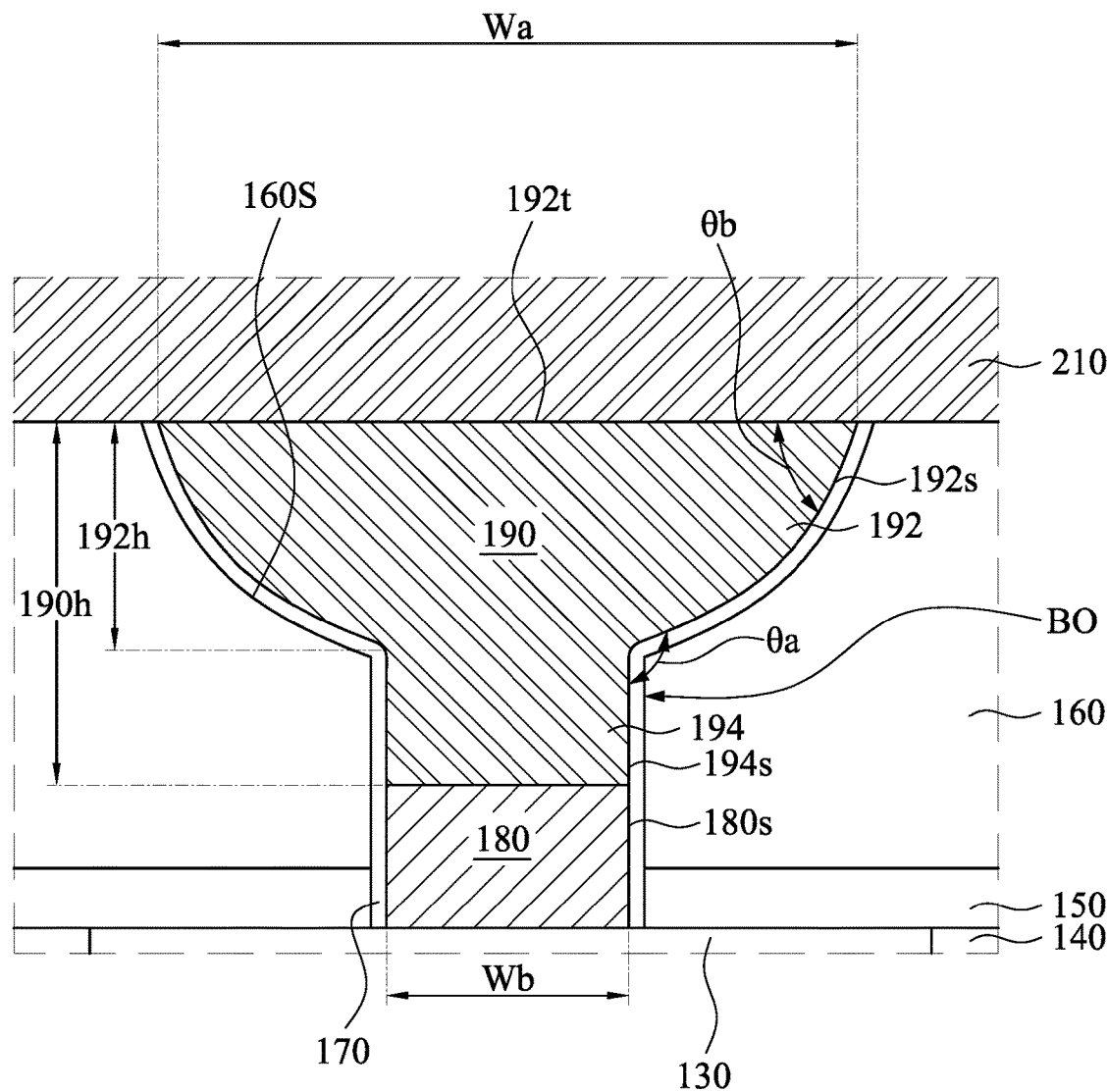
FIG. 4 is an enlarged view of area P in FIG. 3N.

FIG. 4 is an enlarged view of area P in FIG. 3N. Reference is made to FIGS. 3N and 4. The memory device includes a bottom electrode 180, a bottom memory layer 190, a top memory layer 210, and a top electrode 230. The bottom memory layer 190 is over the bottom electrode 180. The top memory layer 210 is over the bottom memory layer 190. The top electrode 230 is over the top memory layer 210. The top memory layer 210 covers the bottom memory layer 190. The bottom memory layer 190 has a funnel shape. That is, a top width Wa of the bottom memory layer 190 is greater than a bottom width Wb of the bottom memory layer 190. Or, the bottom memory layer 190 tapers in a direction from the top memory layer 210 toward the the bottom electrode 180. Stated in another way, the bottom memory layer 190 has a tapered portion 192 and a neck portion 194 between the tapered portion 192 and the bottom electrode 180. The tapered portion 192 is convex and tapers in a direction from the top memory layer 210 toward the neck portion 194. During the memory (writing) operation, the current flows from the top electrode 230 towards the bottom electrode 180 through the top memory layer 210 and the bottom memory layer 190. The top memory layer 210 has a first thermal resistance R1, the tapered portion 192 of the bottom memory layer 190 has a second thermal resistance R2, and the neck portion 194 of the bottom memory layer 190 has a third thermal resistance R3. Since the neck portion 194 has the smallest width, R3>R2>R1. The current density is increased in the neck portion 194 of the bottom memory layer 190, and the neck portion 194 is the hottest region among the memory layers. As such, the heat generated from the current is concentrated in the neck portion 194 of the bottom memory layer 190 and the neck portion 194 is the programmable region for phase changing. The concentrated heat in the neck portion 194 of the bottom memory layer 190 lowers the threshold voltage for the memory operation, and the write current of the memory device can be reduced. As such, the size of the memory cell can be reduced. Further, since the bottom electrode 180 is formed in the bottom opening BO, which has a small CD, the write current can be further reduced.

The bottom memory layer 190 inherits the profile of the bottom opening BO. In greater detail, a width Wb of the neck portion 194 is less than a width Wa of the tapered portion 192. The width Wa of the tapered portion 192 is reduced downwardly. In some embodiments, the maximum value of the width Wa may be in a range of about 50 nm to about 300 nm. If the maximum value of width Wa is less than about 50 nm, the first bottom opening 162 (see FIG. 3D) may not be widened, and the bottom memory layer 190 may not be a funnel shape. If the width Wa is greater than about 300 nm, the layout area of each memory cell may be increased. The tapered portion 192 of the bottom memory layer 190 has a height 192h, and the bottom memory layer 190 has a height 190h. A ratio of the heights 192h/190h is in a range of about 0.2 to about 0.5. If the height ratio is lower than about 0.2, the bottom memory material layer 190' (see FIG. 3I) is not easy to fill the bottom opening BO, and seams and/or voids may be formed in the bottom memory layer 190. If the height ratio is higher than about 0.5, the heat is not easy to be concentrated in the neck portion 194. In some embodiments, a sidewall 192s of the tapered portion 192 is curved, e.g., convex in this case. Also, a sidewall 160S of the dielectric layer 160 facing the bottom memory layer 190 is curved, e.g., concave in this case. On the other hand, a sidewall 194s of the neck portion 194 is substantially straight or vertical. An angle θa is formed at the interface between the sidewall 192s and the sidewall 194s, and the angle θa may be an obtuse angle. In some embodiments, the angle θa may be in a range from about 90 degrees to about 135 degrees. Further, another angle θb is formed at the interface of the top surface 192t and the sidewall 192s of the tapered portion 192, and the angle θb may be an acute angle. In some embodiments, the angle θb may be in a range from about 45 degrees to about 90 degrees. The bottom electrode 180 has a sidewall 180s. Since the bottom electrode 180 and the bottom memory layer 190 are both formed in the bottom opening BO, the sidewall 180s of the bottom electrode 180 and the sidewall 194s of the neck portion 194 are coterminous. Also, the neck portion 194 and the bottom electrode 180 have substantially the same width. The memory device further includes a polymer layer 170 between the second dielectric layer 160 and the bottom memory layer 190. The polymer layer 170 surrounds the bottom memory layer 190 and the bottom electrode 180.

Figure 5:
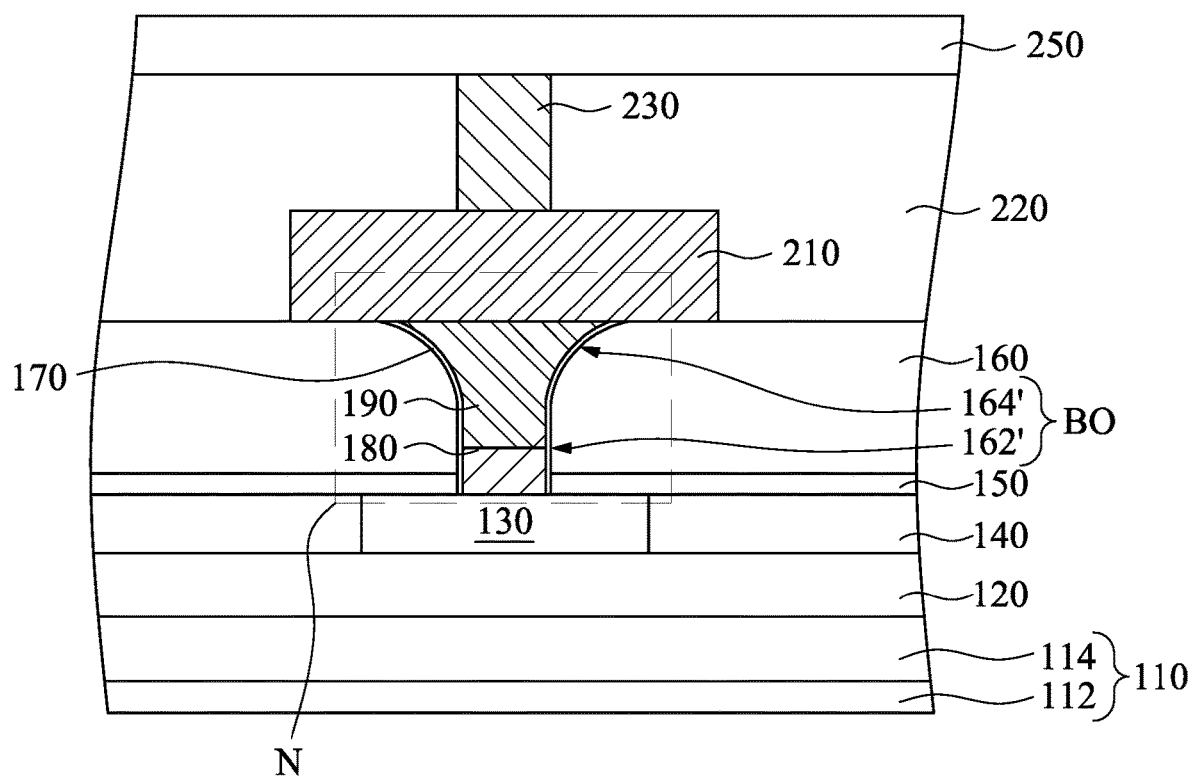
FIG. 5 is a cross-sectional view of a memory device according to some embodiments.
Figure 6:
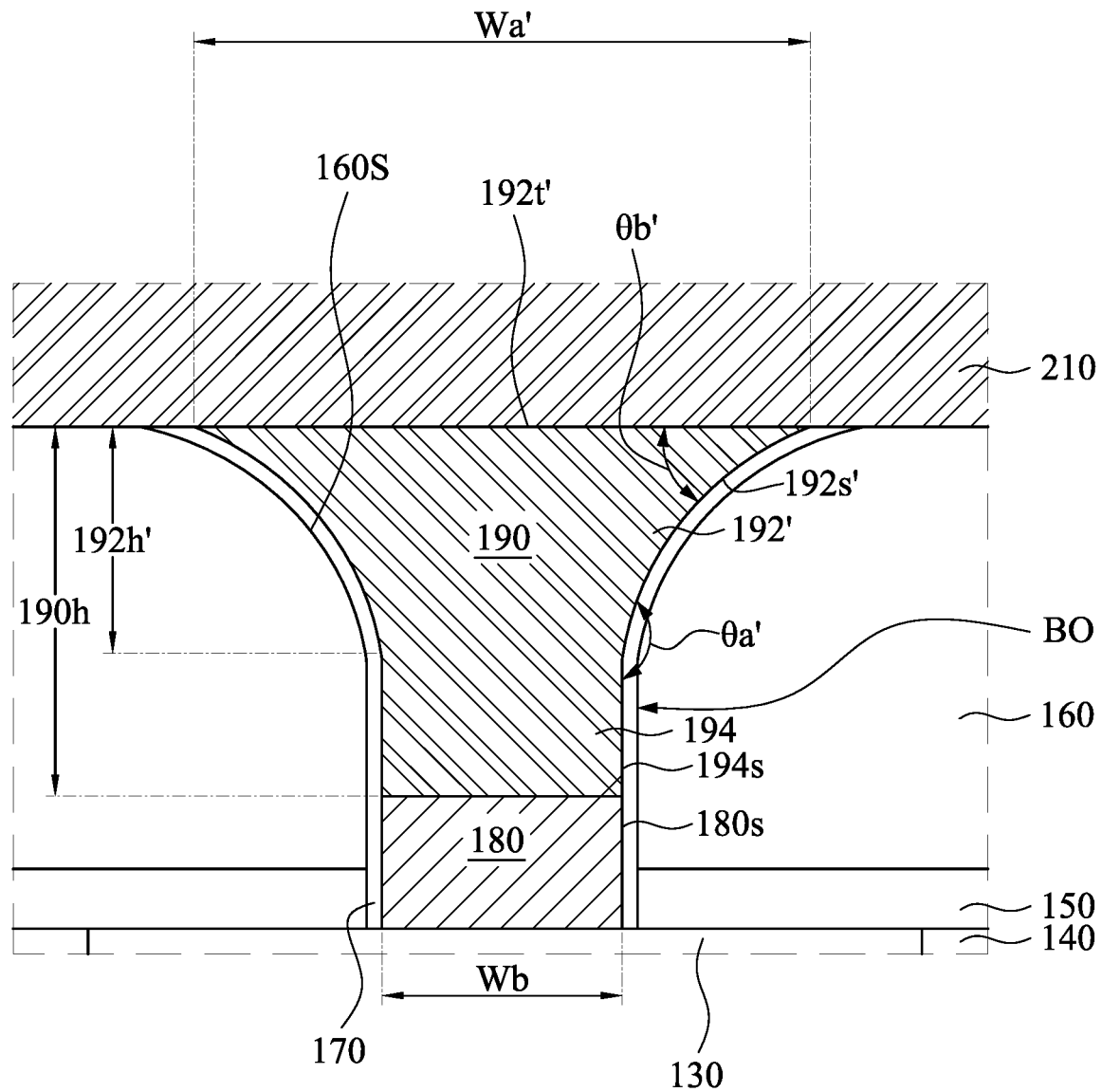
FIG. 6 is an enlarged view of area N in FIG. 5.

FIG. 5 is a cross-sectional view of a memory device according to some embodiments, and FIG. 6 is an enlarged view of area N in FIG. 5. Reference is made to FIGS. 5 and 6. The difference between the memory devices in FIGS. 5 and 3N pertains to the shape of the bottom memory layer 190 (i.e., the profile of the bottom opening BO). In FIGS. 5 and 6, the bottom memory layer 190 also has a funnel shape. In greater detail, the bottom memory layer 190 has a tapered portion 192' and a neck portion 194 between the tapered portion 192' and the bottom electrode 180. A width Wb of the neck portion 194 is less than a width Wa' of the tapered portion 192'. The width Wa' of the tapered portion 192' is reduced downwardly. The tapered portion 192 is concave. In some embodiments, the maximum value of the width Wa' may be in a range of about 50 nm to about 300 nm. If the maximum value of width Wa' is less than about 50 nm, the first bottom opening 162 (see FIG. 3D) may not be widened, and the bottom memory layer 190 may not be a funnel shape. If the width Wa' is greater than about 300 nm, the layout area of each memory cell may be increased. In some embodiments, a sidewall 192s' of the tapered portion 192' is curved, e.g., concave in this case. Also, a sidewall 160S of the dielectric layer 160 facing the bottom memory layer 190 is curved, e.g., convex in this case. The tapered portion 192' of the bottom memory layer 190 has a height 192h', and the bottom memory layer 190 has a height 190h. A ratio of the heights 192h'/190h is in a range of about 0.2 to about 0.5. If the height ratio is lower than about 0.2, the bottom memory material layer 190' (see FIG. 3I) is not easy to fill the bottom opening BO, and seams and/or voids may be formed in the bottom memory layer 190. If the height ratio is higher than about 0.5, the heat is not easy to be concentrated in the neck portion 194. On the other hand, a sidewall 194s of the neck portion 194 is substantially straight or vertical. An angle θa' is formed at the interface between the sidewall 192s' and the sidewall 194s, and the angle θa' may be an obtuse angle. In some embodiments, the angle θa' may be in a range from about 135 degrees to about 180 degrees. Further, another angle θb' is formed at the interface of the top surface 192t' and the sidewall 192s' of the tapered portion 192, and the angle θb' may be an acute angle. In some embodiments, the angle θb' may be in a range from about 0 degrees to about 45 degrees. The bottom electrode 180 has a sidewall 180s. Since the bottom electrode 180 and the bottom memory layer 190 are both formed in the bottom opening BO, the sidewall 180s of the bottom electrode 180 and the sidewall 194s of the neck portion 194 are coterminous. Also, the neck portion 194 and the bottom electrode 180 have substantially the same width.

The profile of the tapered portion 192' (and the profile of the bottom opening BO) attributes to the etching gas in the operation S24 (i.e., patterning the etch stop layer 150). In this case, the selectively etching process may be a dry etching process using etching gases such as $C_4F_8$, $C_4F_6$, combinations thereof, or the like. In some other embodiments, Ar, He, or other suitable gases may be added into the etching process. The etching period may be in a range of about 20 seconds to about 100 seconds. If the etching period is lower than about 20 seconds, the etch stop layer 150 may not be etched to the bottom. If the etching period is greater than about 100 seconds, the etch stop layer 150 may be over etched. In some embodiments, the amount of $C_4F_6$ gas is greater than the amount of $C_4F_8$ gas to obtain the second bottom opening 164 having a concave downward sidewall. In other words, the gas ratio of $C_4F_8/C_4F_6$ is lower than about 1 in this case. Since the other structural and/or manufacturing details of the memory device in FIG. 5 are similar to the memory device in FIGS. 3A-3N, the detailed description is not repeated herein.

Figure 7A:
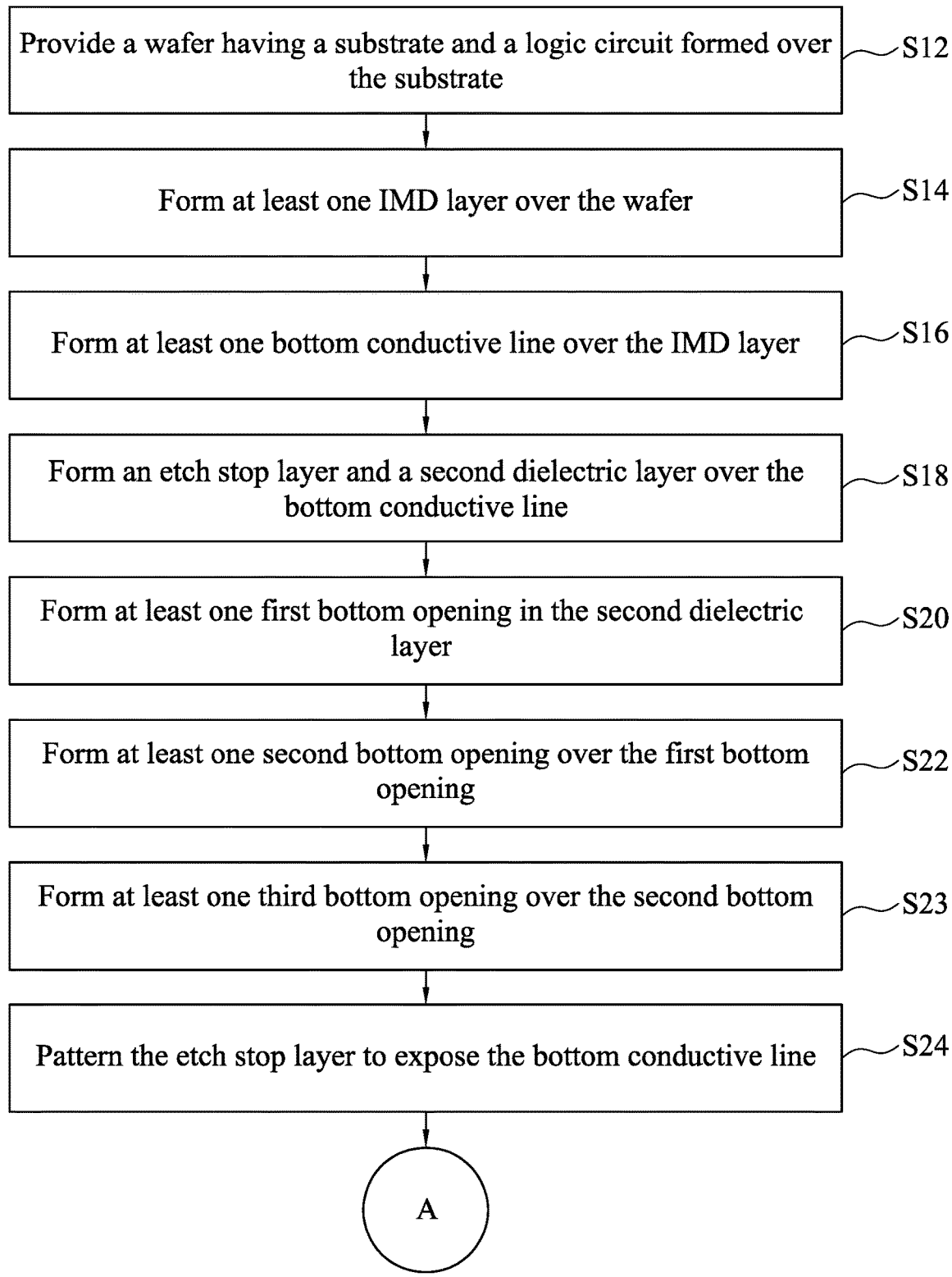
FIGS. 7A and 7B are a flowchart of a method for making a memory device according to aspects of the present disclosure in various embodiments.
Figure 7B:
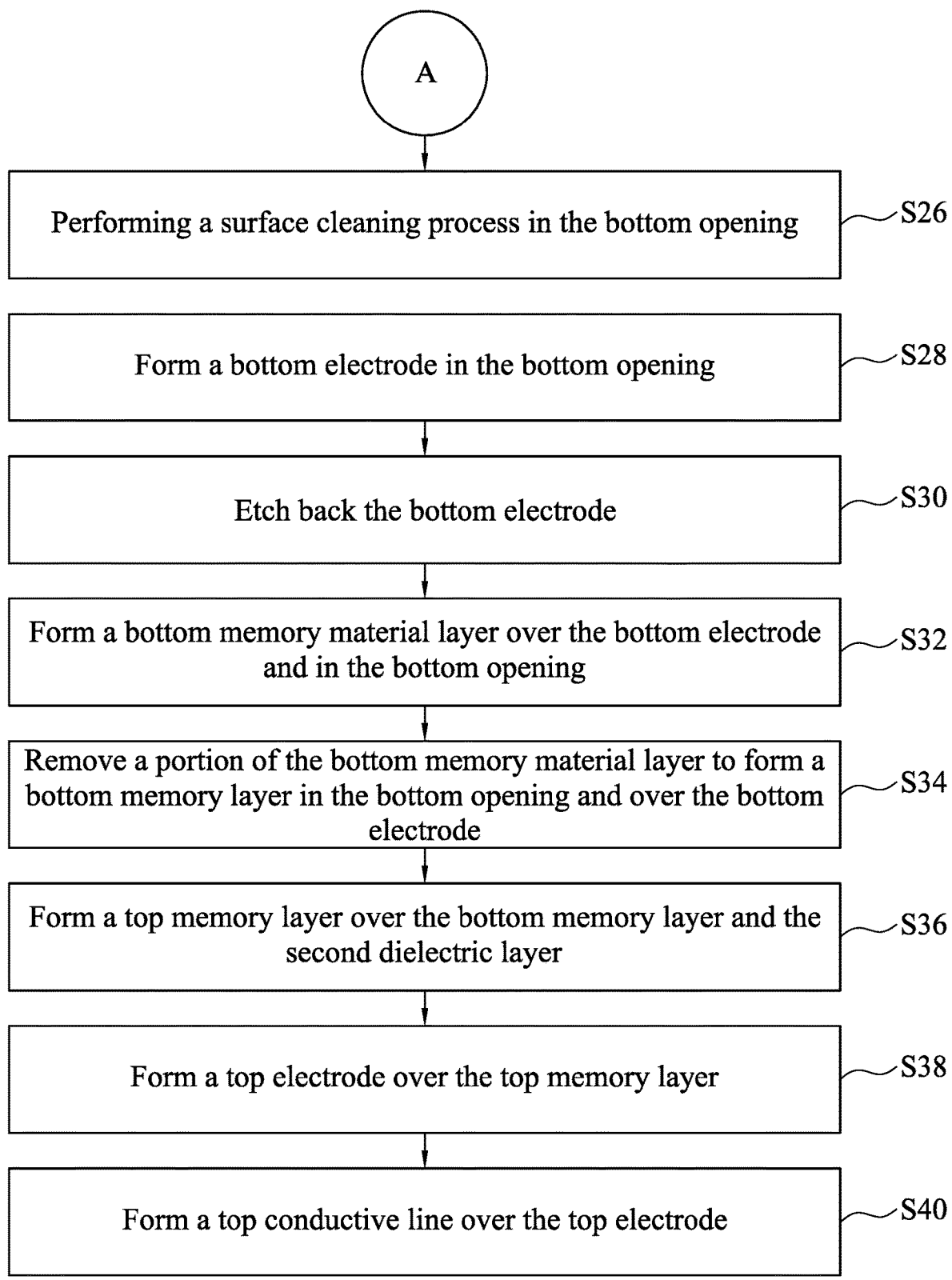
Figure 8A:
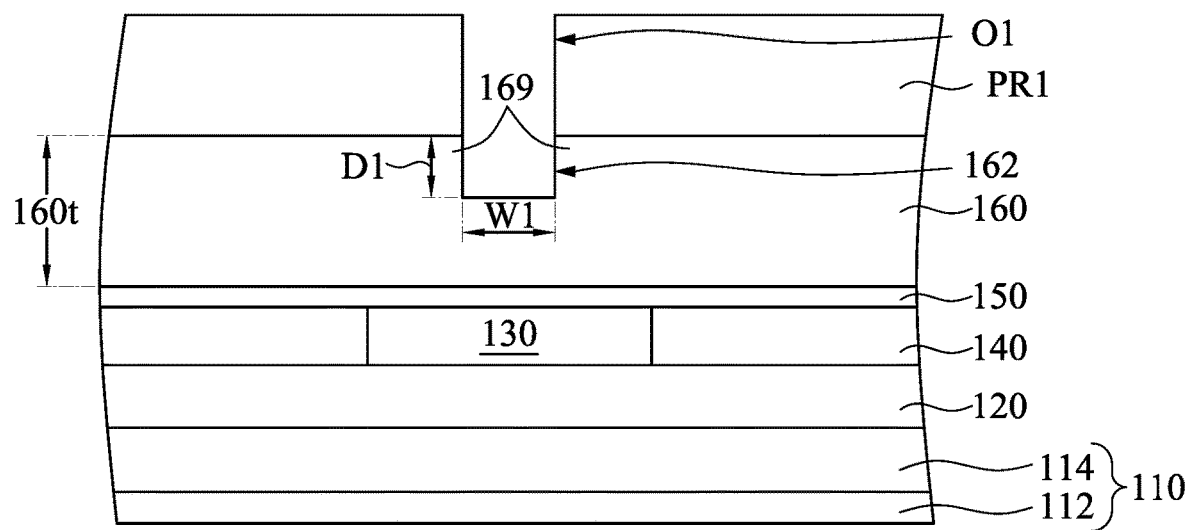
FIGS. 8A-8I illustrate cross-sectional views along the line A-A illustrated in FIG. 1.

FIGS. 7A and 7B are a flowchart of a method M10' for making a memory device according to aspects of the present disclosure in various embodiments. Various operations of the method M10' are discussed in association with perspective diagrams FIGS. 8A-8I. Throughout the various views and illustrative embodiments, like reference numbers are used to designate like elements. The present embodiment may repeat reference numerals and/or letters used in FIGS. 3A-3N. This repetition is for the purpose of simplicity and clarity and does not in itself dictate a relationship between the various embodiments and/or configurations discussed. In the following embodiments, the structural and material details described before are not repeated hereinafter, and only further information is supplied to perform the memory devices of FIGS. 8A-8I. In operation S12 of method M10' of FIG. 7A, a wafer 110 including a substrate 112 and a circuit 114 formed over the substrate 112 is provided, as shown in FIG. 8A. In operation S14 of method M10' of FIG. 7A, at least one IMD layer 120 is formed over the wafer 110, as shown in FIG. 8A. In operation S16 of method M10' of FIG. 7A, at least one bottom conductive line 130 is formed over the IMD layer 120, as shown in FIG. 8A. In operation S18 of method M10' of FIG. 7A, an etch stop layer 150 and a second dielectric layer 160 are sequentially formed over the bottom conductive line 130 and the first dielectric layer 140, as shown in FIG. 8A. In operation S20 of method M10' of FIG. 7A, at least one first bottom opening 162 is formed in the second dielectric layer 160, as shown in FIG. 8A. The first bottom opening 162 has a depth D1 and a width W1. Sharp corners 169 are formed at the interface between the top surface of the second dielectric layer 160 and a sidewall of the first bottom opening 162.

Figure 8B:
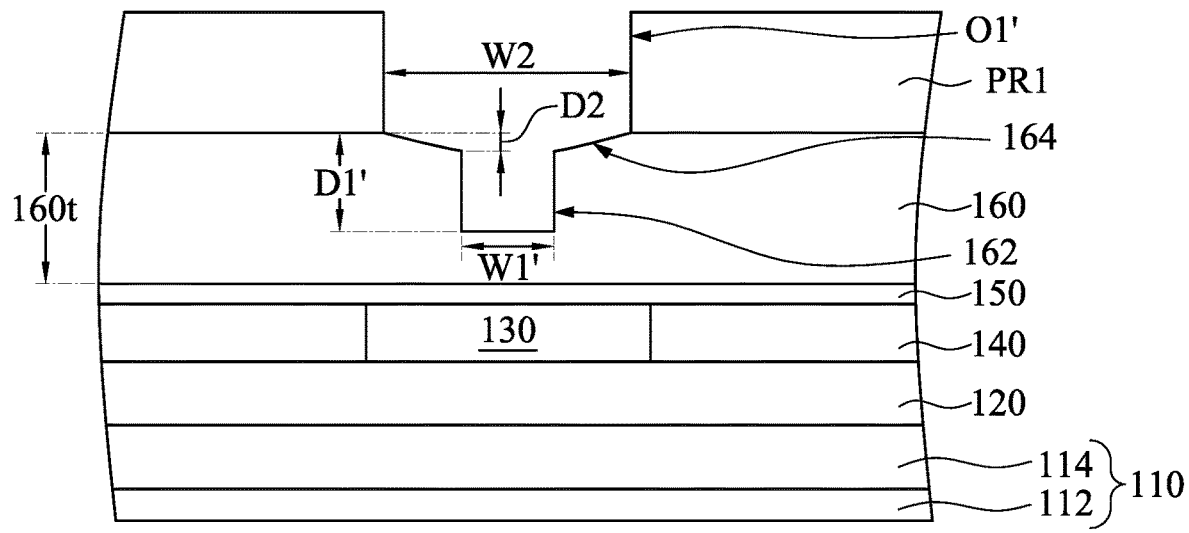

In operation S22 of method M10' in FIG. 7A, at least one second bottom opening 164 is formed over the first bottom opening 162, as shown in FIG. 8B. In other words, top portions of the first bottom openings 162 are widened, and/or the sharp corner 169 (see FIG. 8A) is removed or rounded. Specifically, a photoresist trimming process is performed on the photoresist PR1 to widen the opening O1'. Then, the exposed portions of the second dielectric layer 160 are then patterned (etched) to form second bottom openings 164 over the first bottom openings 162. During this operation, the first bottom openings 162 are deepened but still are blind holes. That is, the depth Dr of the first bottom opening 162 is greater than the depth D1 in FIG. 8A and is still less than the thickness 160t of the second dielectric layer 160. The second bottom openings 164 may be formed by performing an etching process, such as dry etching, wet etching, or combinations thereof. In some embodiments, the etching process is a dry etching process using etching gases as $CH_2F_2$ and/or HBr. Further, He may be added in the etching gases in some embodiments.

In greater detail, the second bottom opening 164 overlaps the first bottom opening 162. The first bottom opening 162 has a width W1' and a depth D V. The width W1' is substantially the same as the width W1 in FIG. 8A, and the depth D1' is greater than the depth D1 in FIG. 8A and is less than the thickness 160t of the second dielectric layer 160. The second bottom opening 164 has a width W2 and a depth D2. The width W2 of the second bottom opening 164 is greater than the width W1' of the first bottom opening 162, and the depth D2 of the second bottom opening 164 is less than the depth D1' of the first bottom opening 162.

Figure 8C:
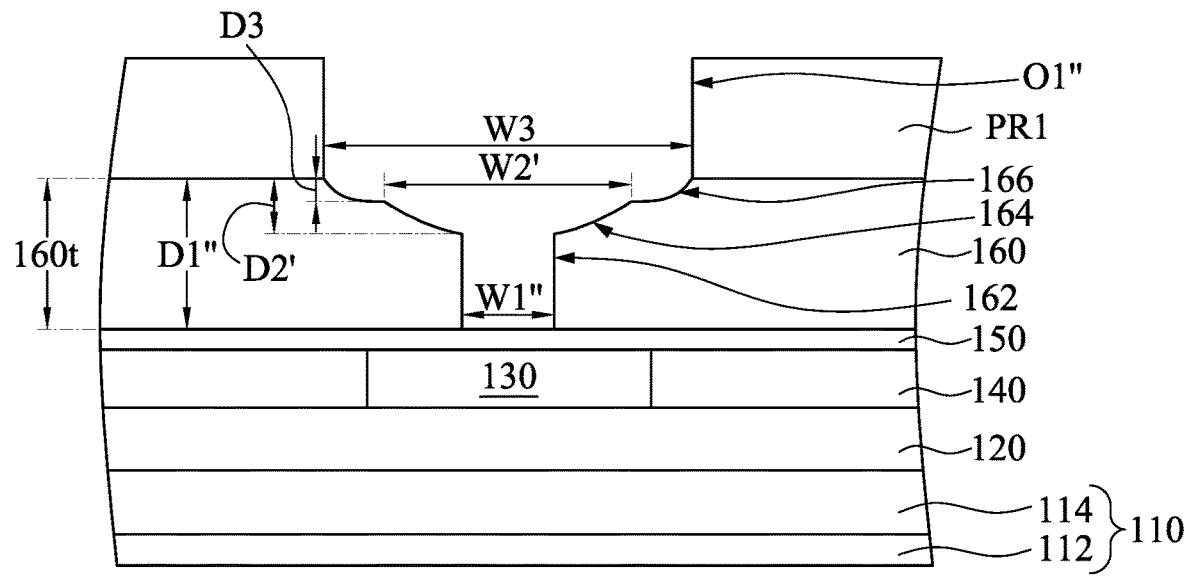

In operation S23 of method M10 in FIG. 7A, at least one third bottom opening 166 is formed over the second bottom opening 164, as shown in FIG. 8C. In other words, top portions of the second bottom openings 164 are widened. Specifically, a photoresist trimming process is performed on the photoresist PR1 to widen the opening O1". In some embodiments, the photoresist trimming process may be an etching process. As such, the opening O1" further exposes another portion of the top surface of the second dielectric layer 160. Then, the exposed portions of the second dielectric layer 160 are then patterned (etched) to form third bottom openings 166 over the second bottom openings 164. During this operation, the first and second bottom openings 162 and 164 are deepened, and the first bottom opening 162 exposes the etch stop layer 150. The third bottom openings 166 may be formed by performing an etching process, such as dry etching, wet etching, or combinations thereof. In some embodiments, the etching process is a dry etching process using etching gases as $CH_2F_2$ and/or HBr. Further, He may be added in the etching gases in some embodiments.

In greater detail, the third bottom opening 166 overlaps the second bottom opening 164. The first bottom opening 162 has a width W1" and a depth D1". The width W1" is substantially the same as the width W1 in FIG. 8A, and the depth D1" is greater than the depth Dr in FIG. 8B and is substantially the same as the thickness 160t of the second dielectric layer 160. The second bottom opening 164 has a width W2' and a depth D2'. The width W2' of the second bottom opening 164 is greater than the width W1" of the first bottom opening 162, and the depth D2' of the second bottom opening 164 is less than the depth D1" of the first bottom opening 162. The third bottom opening 166 has a width W3 and a depth D3. The width W3 of the third bottom opening 166 is greater than the width W2' of the second bottom opening 164, and the depth D3 of the third bottom opening 166 is less than the depth D2' of the second bottom opening 164.

Figure 8D:
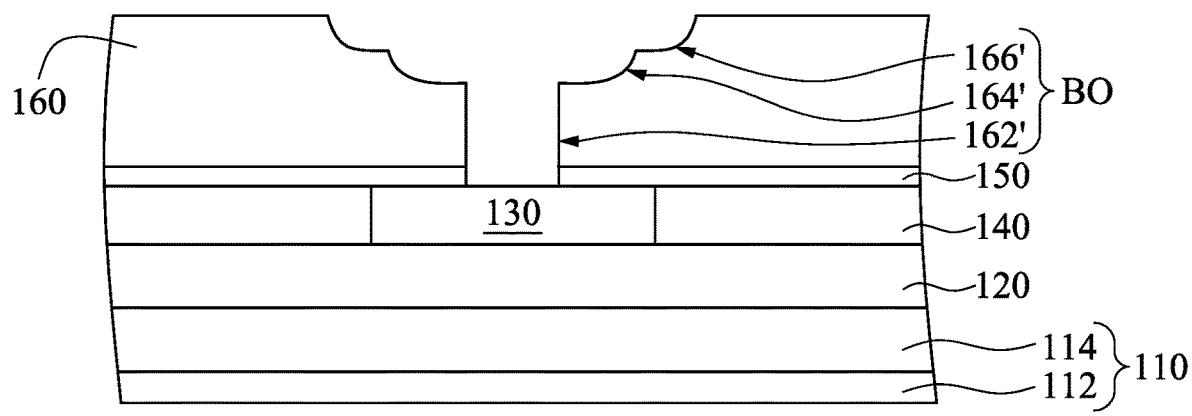

The following manufacturing process of the method M10' is similar to the method M10. For example, in operation S24 of method M10' in FIG. 7A, the etch stop layer 150 is patterned to expose the bottom conductive line 130, as shown in FIG. 8D. In some embodiments, the etching gas includes $C_4F_8$, $C_4F_6$, combinations thereof, or the like. The amount of $C_4F_8$ gas is greater than the amount of $C_4F_6$ gas to obtain the second and third bottom openings 164 and 166 having a concave upward sidewall. In other words, the gas ratio of $C_4F_8/C_4F_6$ is greater than about 1 in this case. In FIG. 8D, the first, second, and third bottom openings 162', 164', and 166' are together referred to as the bottom opening BO, which is funnel shaped.

Figure 8E:
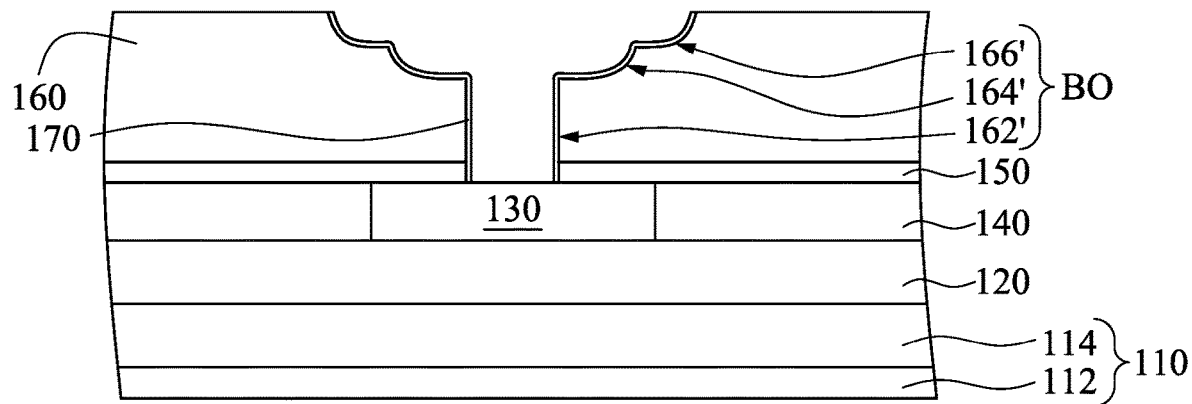
Figure 8F:
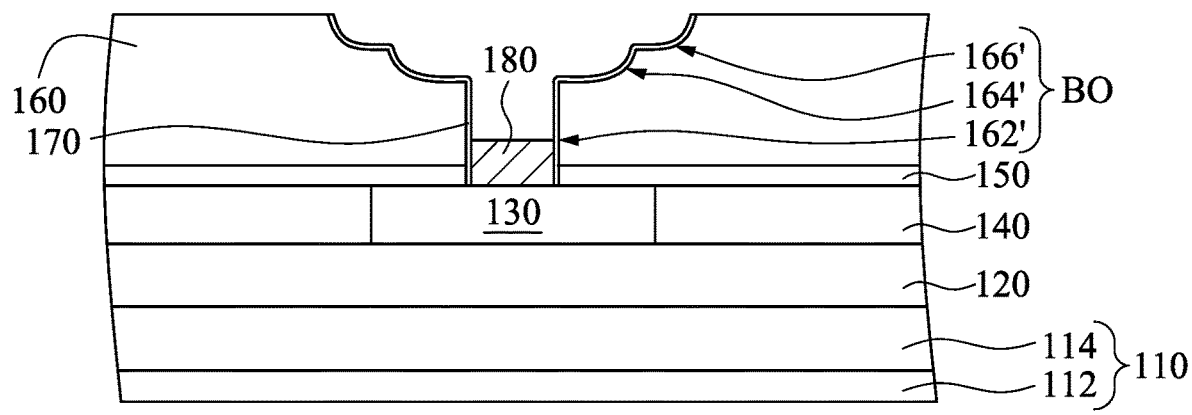
Figure 8G:
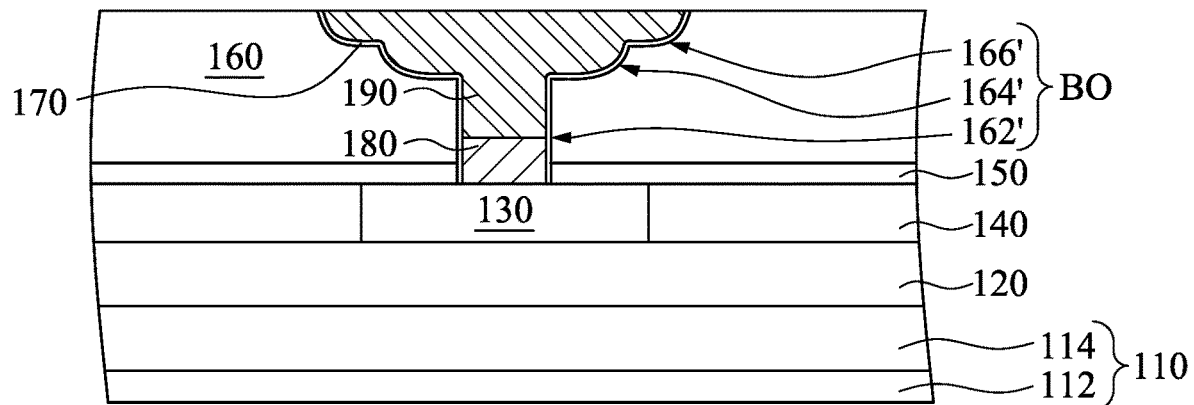
Figure 8H:
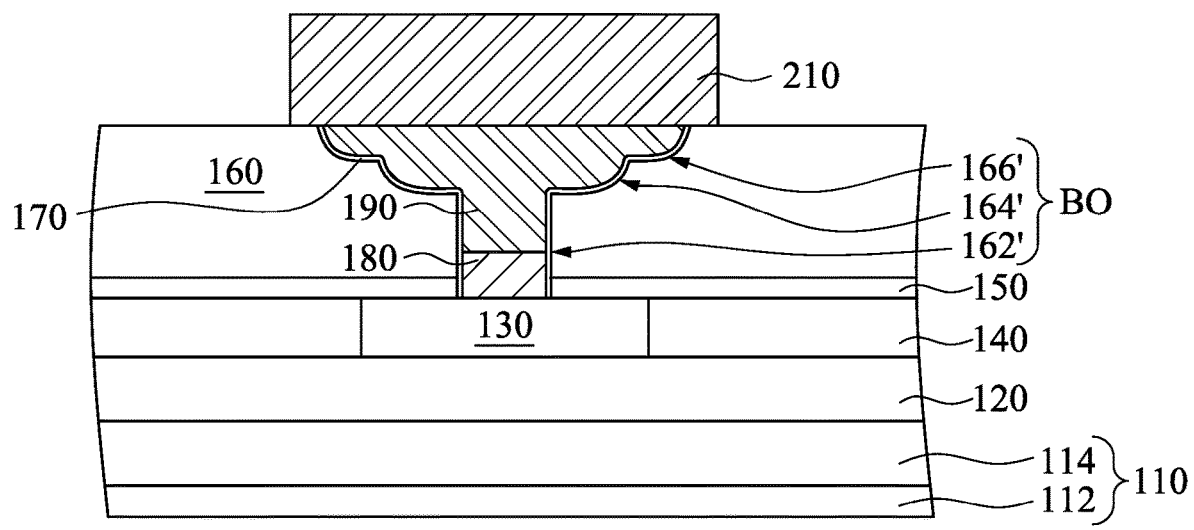

In operation S26 of method M10' in FIG. 7B, a surface cleaning process is performed in the bottom opening BO, as shown in FIG. 8E. In operation S28 of method M10' in FIG. 7B, a bottom electrode 180 is formed in the bottom opening BO, and in operation S30 of method M10' in FIG. 8B, the bottom electrode 180 is etched back, as shown in FIG. 8F. In operation S32 of method M10' in FIG. 7B, a bottom memory material layer is formed over the bottom electrode 180 and in the bottom opening BO, and in operation S34 of method M10' in FIG. 7B, a portion of the bottom memory material layer outside the bottom opening BO is removed to form bottom memory layer 190 in the bottom openings BO and over the bottom electrode 180, as shown in FIG. 8G. In operation S36 of method M10' in FIG. 7B, a top memory layer 210 is formed over the bottom memory layer 190 and the second dielectric layer 160, as shown in FIG. 8H. In operation S38 of method M10' in FIG. 7B, a top electrode 230 is formed over the top memory layer 210, and in operation S40 of method M10' in FIG. 7B, a top conductive line 250 is formed over the top electrode 230, as shown in FIG. 8I.

Figure 8I:
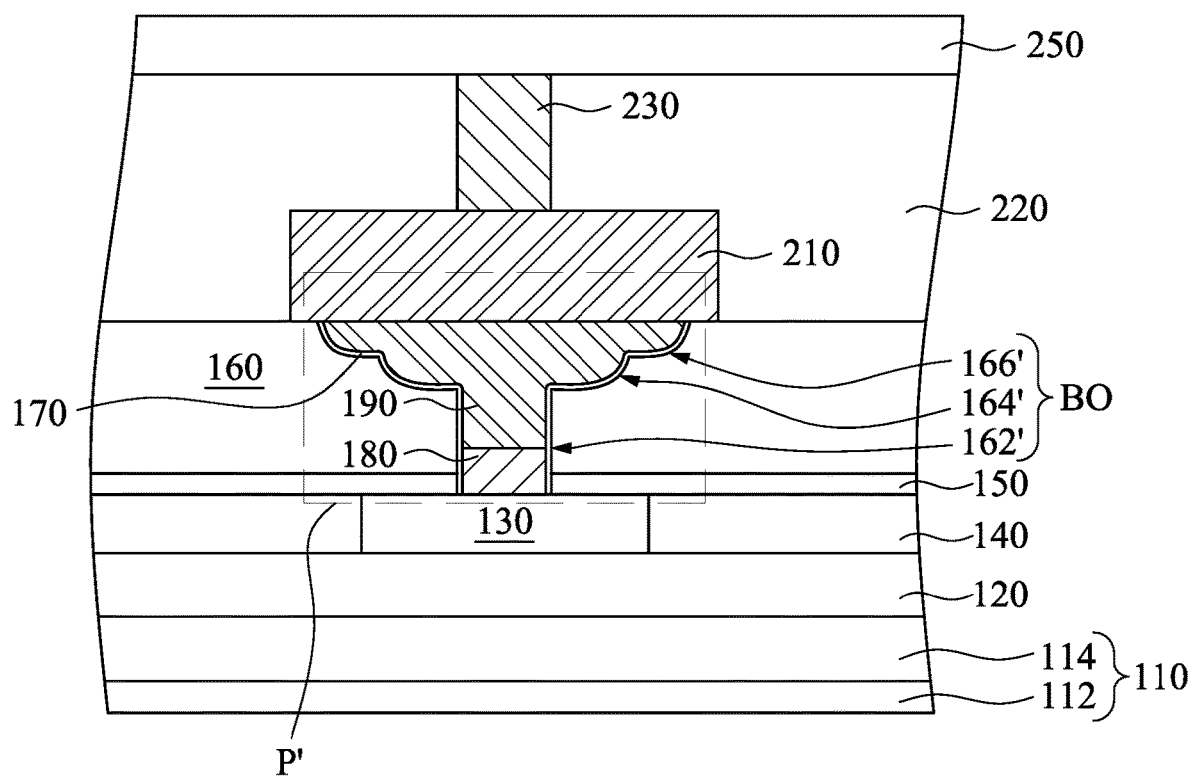
Figure 9:
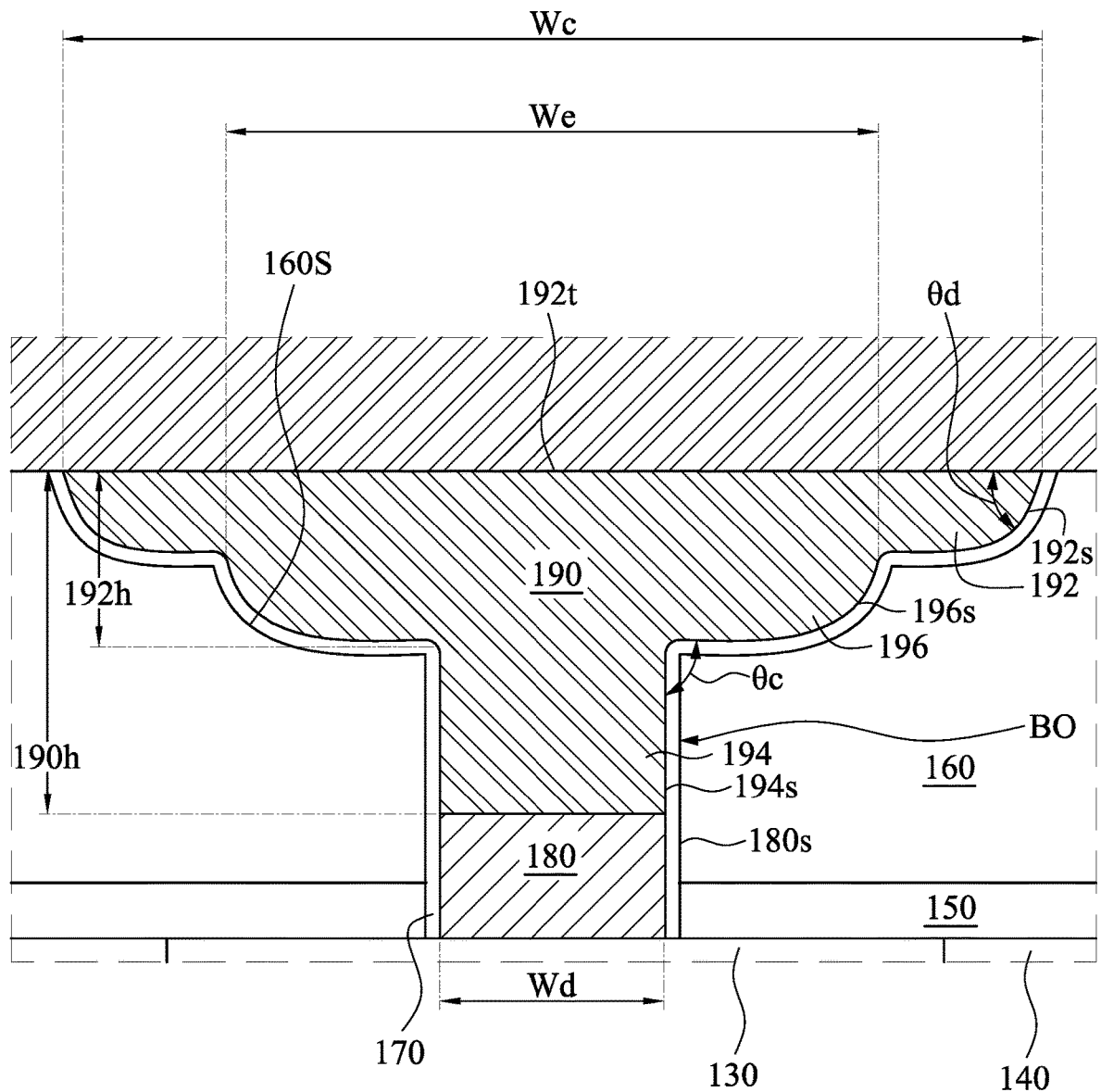
FIG. 9 is an enlarged view of area P' in FIG. 8I.

FIG. 9 is an enlarged view of area P' in FIG. 8I. Reference is made to FIGS. 8I and 9. The memory device includes a bottom electrode 180, a bottom memory layer 190, a top memory layer 210, and a top electrode 230. The bottom memory layer 190 is over the bottom electrode 180. The top memory layer 210 is over the bottom memory layer 190. The top electrode 230 is over the top memory layer 210. The top memory layer 210 covers the bottom memory layer 190. The bottom memory layer 190 has a funnel shape. That is, a top width We of the bottom memory layer 190 is greater than a bottom width Wd of the bottom memory layer 190. Or, the bottom memory layer 190 tapers in a direction from the top memory layer 210 toward the bottom electrode 180. Stated in another way, the bottom memory layer 190 has a first tapered portion 192, a second tapered portion 196, and a neck portion 194. The second tapered portion 196 is between the first tapered portion 192 and the neck portion 194, and the neck portion 194 is between the second tapered portion 196 and the bottom electrode 180. During the memory (writing) operation, the current flows from the top electrode 230 towards the bottom electrode 180 through the top memory layer 210 and the bottom memory layer 190. The top memory layer 210 has a first thermal resistance R1, the first tapered portion 192 of the bottom memory layer 190 has a second thermal resistance R2, the second tapered portion 196 of the bottom memory layer 190 has a third thermal resistance R3, and the neck portion 194 of the bottom memory layer 190 has a fourth thermal resistance R4. Since the neck portion 194 has the smallest width, R4>R3>R2>R1. The current density is increased in the neck portion 194 of the bottom memory layer 190, and the neck portion 194 is the hottest region among the memory layers. As such, the heat generated from the current is concentrated in the neck portion 194 of the bottom memory layer 190 and the neck portion 194 is the programmable region for phase changing. The concentrated heat in the neck portion 194 of the bottom memory layer 190 lowers the threshold voltage for the memory operation, and the write current of the memory device can be reduced. As such, the size of the memory cell can be reduced. Further, since the bottom electrode 180 is formed in the bottom opening BO, which has a small CD, the write current can be further reduced.

The bottom memory layer 190 inherits the profile of the bottom opening BO. In greater detail, a width Wd of the neck portion 194 is less than widths Wc, We of the first and the second tapered portion 192 and 196. The widths Wc and We of the first and second tapered portion 192 and 196 are both reduced downwardly. In some embodiments, the maximum value of the width Wc may be in a range of about 50 nm to about 300 nm. If the maximum value of width Wc is less than about 50 nm, the first bottom opening 162 (see FIG. 8A) may not be widened, and the bottom memory layer 190 may not be a funnel shape. If the width Wc is greater than about 300 nm, the layout area of each memory cell may be increased. The first and second tapered portions 192 and 196 of the bottom memory layer 190 have a height 192$h$, and the bottom memory layer 190 has a height 190$h$. A ratio of the heights 192$h$/190$h$ is in a range of about 0.2 to about 0.5. If the height ratio is lower than about 0.2, the bottom memory material layer 190' (see FIG. 3I) is not easy to fill the bottom opening BO, and seams and/or voids may be formed in the bottom memory layer 190. If the height ratio is higher than about 0.5, the heat is not easy to be focused in the neck portion 194. In some embodiments, a sidewall 192$s$ of the first tapered portion 192 is curved, e.g., convex in this case; and a sidewall 196$s$ of the second tapered portion 196 is curved, e.g., convex in this case. In some embodiments, the curvatures of the sidewalls 192$s$ and 196$s$ are different. Also, a sidewall 160S of the dielectric layer 160 facing the bottom memory layer 190 is curved, e.g., concave in this case. On the other hand, a sidewall 194$s$ of the neck portion 194 is substantially straight or vertical. An angle θc is formed at the interface between the sidewall 196$s$ and the sidewall 194$s$, and the angle θc is an obtuse angle. In some embodiments, the angle θc may be in a range from about 90 degrees to about 135 degrees. Further, another angle θd is formed at the interface of the top surface 192$t$ and the sidewall 192$s$ of the tapered portion 192, and the angle θd may be an acute angle. In some embodiments, the angle θd may be in a range from about 45 degrees to about 90 degrees. The bottom electrode 180 has a sidewall 180$s$. Since the bottom electrode 180 and the bottom memory layer 190 are both formed in the bottom opening BO, the sidewall 180$s$ of the bottom electrode 180 and the sidewall 194$s$ of the neck portion 194 are coterminous. Also, the neck portion 194 and the bottom electrode 180 have substantially the same width. The memory device further includes a polymer layer 170 between the second dielectric layer 160 and the bottom memory layer 190. The polymer layer 170 surrounds the bottom memory layer 190 and the bottom electrode 180.

Figure 10:
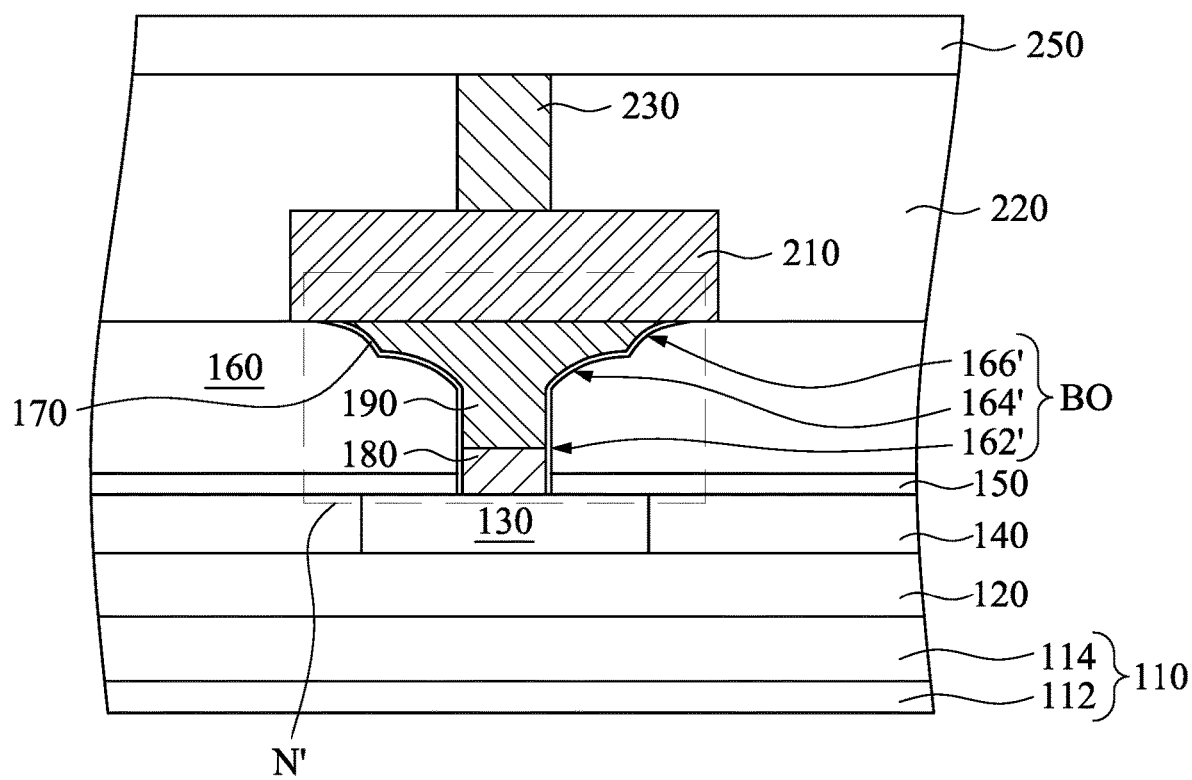
FIG. 10 is a cross-sectional view of a memory device according to some embodiments.
Figure 11:
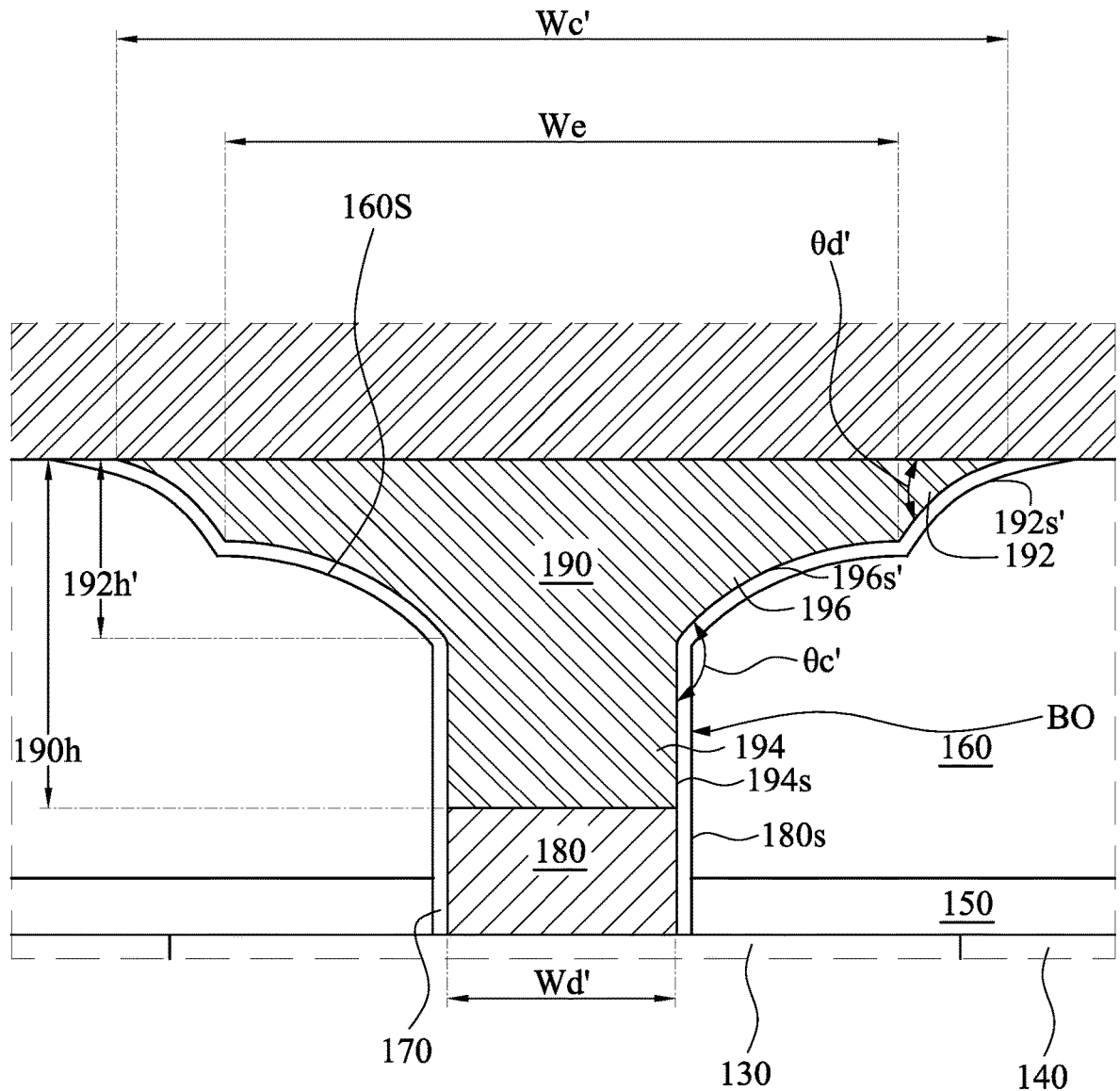
FIG. 11 is an enlarged view of area N' in FIG. 10.

FIG. 10 is a cross-sectional view of a memory device according to some embodiments, and FIG. 11 is an enlarged view of area N' in FIG. 10. Reference is made to FIGS. 10 and 11. The difference between the memory devices in FIGS. 10 and 8I pertains to the shape of the bottom memory layer 190 (i.e., the profile of the bottom opening BO). In FIGS. 10 and 11, the bottom memory layer 190 also has a funnel shape. In greater detail, the bottom memory layer 190 has a first tapered portion 192', a second tapered portion 196', and a neck portion 194. The second tapered portion 196' is between the first tapered portion 192' and the neck portion 194, and the neck portion 194 is between the second tapered portion 196' and the bottom electrode 180. A width Wd' of the neck portion 194 is less than widths Wc' and We' of the first and second tapered portions 192' and 196'. The widths Wc' and We' of the first and second tapered portion 192' and 196' are both reduced downwardly. In some embodiments, the maximum value of the width Wc' may be in a range of about 50 nm to about 300 nm. If the maximum value of width Wc' is less than about 50 nm, the first bottom opening 162 (see FIG. 8A) may not be widened, and the bottom memory layer 190 may not be a funnel shape. If the width Wc' is greater than about 300 nm, the layout area of each memory cell may be increased. In some embodiments, a sidewall 192$s$' of the first tapered portion 192' is curved, e.g., concave in this case; and a sidewall 196$s$' of the second tapered portion 196' is curved, e.g., concave in this case. In some embodiments, the curvatures of the sidewalls 192$s$ and 196$s$ are different. Also, a sidewall 160S of the dielectric layer 160 facing the bottom memory layer 190 is curved, e.g., convex in this case. The first and second tapered portion 192' and 196' of the bottom memory layer 190 has a height 192$h$', and the bottom memory layer 190 has a height 190$h$. A ratio of the heights 192$h$'/190$h$ is in a range of about 0.2 to about 0.5. If the height ratio is lower than about 0.2, the bottom memory material layer 190' (see FIG. 3I) is not easy to fill the bottom opening BO, and seams and/or voids may be formed in the bottom memory layer 190. If the height ratio is higher than about 0.5, the heat is not easy to be focused in the neck portion 194. On the other hand, a sidewall 194$s$ of the neck portion 194 is substantially straight or vertical. An angle θc' is formed at the interface between the sidewall 196$s$' and the sidewall 194$s$, and the angle θc' may be an obtuse angle. In some embodiments, the angle θc' may be in a range from about 135 degrees to about 180 degrees. Further, another angle θd' is formed at the interface of the top surface 192$t$' and the sidewall 192$s$' of the tapered portion 192', and the angle θd' may be an acute angle. In some embodiments, the angle θd' may be in a range from about 0 degrees to about 45 degrees. The bottom electrode 180 has a sidewall 180$s$. Since the bottom electrode 180 and the bottom memory layer 190 are both formed in the bottom opening BO, the sidewall 180$s$ of the bottom electrode 180 and the sidewall 194$s$ of the neck portion 194 are coterminous. Also, the neck portion 194 and the bottom electrode 180 have substantially the same width.

The profile of the first and second tapered portion 192' and 196' (and the profile of the bottom opening BO) attributes to the etching gas in the operation S24 (i.e., patterning the etch stop layer 150). In this case, the selectively etching process may be a dry etching process using etching gases such as $C_4F_8$, $C_4F_6$, combinations thereof, or the like. In some other embodiments, Ar, He, or other suitable gases may be added into the etching process. The etching period may be in a range of about 20 seconds to about 100 seconds. If the etching period is lower than about 20 seconds, the etch stop layer 150 may not be etched to the bottom. If the etching period is greater than about 100 seconds, the etch stop layer 150 may be over etched. In some embodiments, the amount of $C_4F_6$ gas is greater than the amount of $C_4F_8$ gas to obtain the second and third bottom opening 164 and 166 having a concave downward sidewall. In other words, the gas ratio of $C_4F_8/C_4F_6$ is lower than about 1 in this case. Since the other structural and/or manufacturing details of the memory device in FIG. 10 are similar to the memory device in FIGS. 8A-8I, the detailed description is not repeated herein.

According to some embodiments, a phase change memory device includes a bottom electrode, a bottom memory layer, a top memory layer, and a top electrode. The bottom memory layer is over the bottom electrode. The bottom memory layer has a first height and includes a tapered portion and a neck portion. The tapered portion has a second height. A ratio of the second height to the first height is in a range of about 0.2 to about 0.5. The neck portion is between the tapered portion and the bottom electrode. The top memory layer is over the bottom memory layer. The tapered portion of the bottom memory layer tapers in a direction from the top memory layer toward the neck portion. The top electrode is over the top memory layer.

According to some embodiments, a phase change memory device includes a dielectric layer, a bottom electrode, a bottom memory layer, a top memory layer, and a top electrode. The bottom memory layer is over the bottom electrode and in the dielectric layer. The bottom memory layer has a funnel shape. A top width of the bottom memory layer is greater than a width of the bottom electrode. The top width of the bottom memory layer is in a range of about 50 nm to about 300 nm. The top memory layer is over the bottom memory layer. The top electrode is over the top memory layer.

According to some embodiments, a method for manufacturing a phase change memory device includes forming a dielectric layer over a substrate. A first opening is formed in the dielectric layer. A second opening is formed to overlap the first opening in the dielectric layer. The second opening is wider than the first opening and the first opening is deeper than the second opening. A bottom electrode is formed in the first opening of the dielectric layer. A bottom memory layer is formed in the first opening and the second opening of the dielectric layer and over the bottom electrode. A top electrode is formed over the bottom memory layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A phase change memory device, comprising:
   a bottom electrode;
   a bottom memory layer over the bottom electrode, wherein the bottom memory layer has a first height and comprises:
      a tapered portion having a second height, wherein a ratio of the second height to the first height is in a range of about 0.2 to about 0.5; and
      a neck portion between the tapered portion and the bottom electrode;
   a top memory layer over the bottom memory layer, wherein the tapered portion of the bottom memory layer tapers in a direction from the top memory layer toward the neck portion; and
   a top electrode over the top memory layer.

2. The phase change memory device of claim 1, wherein the neck portion and the bottom electrode have substantially the same width.

3. The phase change memory device of claim 1, wherein a sidewall of the neck portion and a sidewall of the bottom electrode are coterminous.

4. The phase change memory device of claim 1, wherein a sidewall of the neck portion is substantially straight.

5. The phase change memory device of claim 1, wherein a sidewall of the tapered portion is convex.

6. The phase change memory device of claim 1, wherein a sidewall of the tapered portion is concave.

7. The phase change memory device of claim 1, wherein the tapered portion comprises:
   a top portion; and
   a bottom portion between the top portion and the neck portion.

8. The phase change memory device of claim 7, wherein curvatures of sidewalls of the top portion and the bottom portion are different.

9. The phase change memory device of claim 1, further comprising a polymer layer surrounding the bottom memory layer.

10. The phase change memory device of claim 9, wherein the polymer layer further surrounds the bottom electrode.

11. A phase change memory device, comprising:
    a dielectric layer;
    a bottom electrode;
    a bottom memory layer over the bottom electrode and in the dielectric layer, wherein the bottom memory layer has a funnel shape, a top width of the bottom memory layer is greater than a width of the bottom electrode, and the top width of the bottom memory layer is in a range of about 50 nm to about 300 nm;
    a top memory layer over the bottom memory layer; and
    a top electrode over the top memory layer.

12. The phase change memory device of claim 11, wherein the bottom memory layer comprises a tapered portion and a neck portion between the tapered portion and the bottom electrode, and the tapered portion is convex.

13. The phase change memory device of claim 11, wherein bottom memory layer comprises a tapered portion and a neck portion between the tapered portion and the bottom electrode, and the tapered portion is concave.

14. A phase change memory device, comprising:
    a dielectric layer;
    a bottom electrode;
    a bottom memory layer over the bottom electrode and in the dielectric layer, wherein a sidewall of the dielectric layer facing the bottom memory layer is curved;
    a polymer layer between the bottom memory layer and the dielectric layer;
    a top memory layer over the bottom memory layer; and
    a top electrode over the top memory layer.

15. The phase change memory device of claim 14, wherein the polymer layer is in contact with the bottom memory layer and the dielectric layer.

16. The phase change memory device of claim 14, wherein the polymer layer is in contact with the bottom electrode.

17. The phase change memory device of claim 14, wherein the polymer layer includes $SiClO_x$, $SiBrO_x$, $CH_x$, or combinations thereof.

18. The phase change memory device of claim 14, wherein the polymer layer has a thickness in a range of about 1 nm to about 2 nm.

19. The phase change memory device of claim 14, wherein the polymer layer is in contact with the top memory layer.

20. The phase change memory device of claim 14, wherein the top memory layer is wider than the bottom memory layer.

* * * * *